United States Patent
Watanabe et al.

(10) Patent No.: US 9,144,971 B2
(45) Date of Patent: Sep. 29, 2015

(54) PIEZOELECTRIC MATERIAL, PIEZOELECTRIC ELEMENT, AND ELECTRONIC APPARATUS

(71) Applicant: CANON KABUSHIKI KAISHA, Tokyo (JP)

(72) Inventors: Takayuki Watanabe, Yokohama (JP); Shunsuke Murakami, Kawasaki (JP); Tatsuo Furuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/139,297

(22) Filed: Dec. 23, 2013

(65) Prior Publication Data

US 2014/0184878 A1 Jul. 3, 2014

(30) Foreign Application Priority Data

Dec. 28, 2012 (JP) ................ 2012-287243

(51) Int. Cl.
*H04N 5/225* (2006.01)
*H04N 9/04* (2006.01)
(Continued)

(52) U.S. Cl.
CPC .......... *B41J 2/14201* (2013.01); *B41J 2/14233* (2013.01); *C04B 35/4682* (2013.01);
(Continued)

(58) Field of Classification Search
CPC ................ B41J 2/14201; B41J 2002/14266; B41J 2/1607; H01L 41/04; H01L 41/08; H01L 41/09
USPC .......... 348/340, 207.99, 208.7, 374; 310/311, 310/358; 347/71, 44, 72
See application file for complete search history.

(56) References Cited

U.S. PATENT DOCUMENTS 8,547,001 B2 * 10/2013 Saito et al. .................... 310/358
8,562,113 B2 * 10/2013 Harigai et al. ................. 310/311
(Continued)

FOREIGN PATENT DOCUMENTS

CN        1635592 A     7/2005
CN    101026035        8/2007
(Continued)

OTHER PUBLICATIONS

T. Karaki, et al.; Improvement of Coercive Electric Field in BaTiO3 Piezoelectric Ceramics; 15th US-Japan Seminar on Dielectric and Piezoelectric Ceramics Extended Abstract, p. 40-41, Nov. 2011.
(Continued)

*Primary Examiner* — Nhan T Tran
(74) *Attorney, Agent, or Firm* — Canon USA Inc. IP Division

(57) ABSTRACT

A piezoelectric material includes a metal oxide represented by general formula (1) below, a Mn content is 0.04 parts by weight or more and 0.36 parts by weight or less, a Li content α is 0.0013 parts by weight or more and 0.0280 parts by weight or less, a Bi content β is 0.042 parts by weight or more and 0.850 parts by weight or less, and the contents α and β satisfy $0.5 \leq (\alpha \cdot MB)/(\beta \cdot ML) \leq 1$ $(Ba_{1-x}Ca_x)_a(Ti_{1-y-z}Zr_ySn_z)O_3$ (1) (where x, y, z, and a satisfy $0.09 \leq x \leq 0.30$, $0.025 \leq y \leq 0.074$, $0 \leq z \leq 0.02$, and $0.986 \leq a \leq 1.02$).

A piezoelectric material according to an embodiment of the present invention contains no lead, has a low degree of temperature dependency of piezoelectric performance within operation temperature ranges of piezoelectric elements, and good piezoelectric properties.

26 Claims, 18 Drawing Sheets

(51) Int. Cl.

| | |
|---|---|
| H01L 41/00 | (2013.01) |
| B41J 2/045 | (2006.01) |
| B41J 2/14 | (2006.01) |
| C04B 35/468 | (2006.01) |
| H01L 41/43 | (2013.01) |
| H01L 41/09 | (2006.01) |
| H01L 41/187 | (2006.01) |
| H02N 2/10 | (2006.01) |
| H02N 2/16 | (2006.01) |
| C04B 35/626 | (2006.01) |
| H01L 41/083 | (2006.01) |
| H01L 41/047 | (2006.01) |

(52) U.S. Cl.
CPC ....... *C04B35/6261* (2013.01); *C04B 35/62655* (2013.01); *C04B 35/62695* (2013.01); *H01L 41/083* (2013.01); *H01L 41/09* (2013.01); *H01L 41/0973* (2013.01); *H01L 41/1871* (2013.01); *H01L 41/43* (2013.01); *H02N 2/106* (2013.01); *H02N 2/163* (2013.01); *B41J 2002/14258* (2013.01); *B41J 2202/03* (2013.01); *C04B 2235/3203* (2013.01); *C04B 2235/3208* (2013.01); *C04B 2235/3236* (2013.01); *C04B 2235/3244* (2013.01); *C04B 2235/3248* (2013.01); *C04B 2235/3262* (2013.01); *C04B 2235/3293* (2013.01); *C04B 2235/3298* (2013.01); *C04B 2235/5445* (2013.01); *C04B 2235/5454* (2013.01); *C04B 2235/604* (2013.01); *C04B 2235/6567* (2013.01); *C04B 2235/77* (2013.01); *C04B 2235/786* (2013.01); *C04B 2235/79* (2013.01); *H01L 41/0477* (2013.01)

(56) References Cited

U.S. PATENT DOCUMENTS

| | | | |
|---|---|---|---|
| 8,714,712 | B2 | 5/2014 | Hamada |
| 2010/0096952 | A1* | 4/2010 | Fukuoka ............... 310/365 |
| 2010/0220427 | A1 | 9/2010 | Symes, Jr. |
| 2011/0164331 | A1 | 7/2011 | Sugiyama |
| 2011/0298336 | A1 | 12/2011 | Saito et al. |
| 2012/0033343 | A1 | 2/2012 | Yoon |
| 2012/0038714 | A1 | 2/2012 | Harigai et al. |
| 2013/0056671 | A1* | 3/2013 | Kubota et al. ............... 310/311 |
| 2013/0106960 | A1* | 5/2013 | Wang ............... 347/71 |
| 2013/0270965 | A1* | 10/2013 | Hayashi et al. ............... 310/311 |
| 2013/0278681 | A1* | 10/2013 | Saito et al. ............... 310/365 |
| 2013/0328974 | A1* | 12/2013 | Tanaka et al. ............... 347/70 |
| 2014/0042875 | A1* | 2/2014 | Suenaga et al. ............... 310/365 |
| 2014/0152144 | A1* | 6/2014 | Watanabe et al. ............... 310/311 |
| 2014/0265724 | A1* | 9/2014 | Aida et al. ............... 310/311 |

FOREIGN PATENT DOCUMENTS

| | | |
|---|---|---|
| CN | 101935212 A | 1/2011 |
| CN | 101970374 A | 2/2011 |
| CN | 102531578 A | 7/2012 |
| CN | 102531593 A | 7/2012 |
| EP | 2749550 A2 | 7/2014 |
| JP | 4039029 B2 | 1/2008 |
| JP | 2009-215111 A | 9/2009 |
| JP | 2010-120835 A | 6/2010 |
| TW | 201432963 A | 8/2014 |
| WO | 2012/093646 A1 | 7/2012 |
| WO | 2012/105584 A1 | 8/2012 |
| WO | 2013/005700 A1 | 1/2013 |
| WO | 2013/005701 A1 | 1/2013 |
| WO | 2013/005702 A1 | 1/2013 |

OTHER PUBLICATIONS

Karaki, T., et al., "Modified BaTiO3 Piezoelectric Ceramics with Bi2O3—Li2O Additive", Ferroelectrics, 2012, pp. 83-87, 439.

Yoon, M.-S., et al., "Effects of A-site Ca and B-site Zr substitution on dielectric properties and microstructure in tin-doped BaTiO3—CaTiO3 composites", Ceramics International, 2008, pp. 1941-1948, 34.

U.S. Appl. No. 14/329,689, filed Jul. 11, 2014, Kanako Oshima.

U.S. Appl. No. 14/328,470, filed Jul. 10, 2014, Hidenori Tanaka.

Rahul Prakash, "Synthesis, Characterization and effect of Atmosphere on sintering Behavior of BaTiO3 Nano-Powders", Department of Ceramic Engineering National Institute of Technology Rourkela 2011, 41 pgs.

* cited by examiner

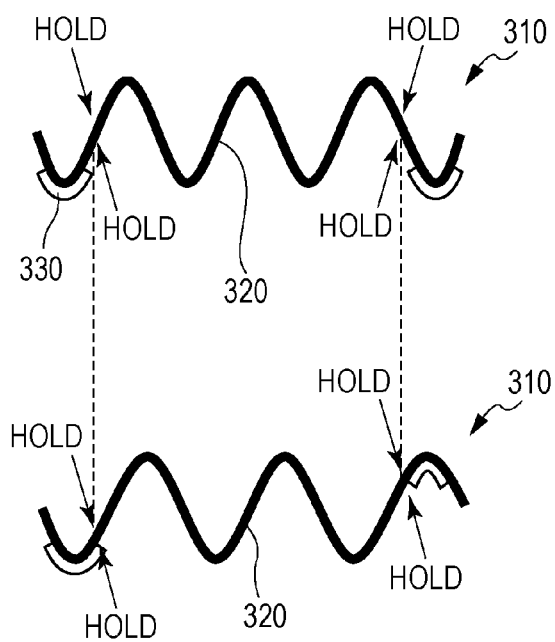

PIEZOELECTRIC MATERIAL, PIEZOELECTRIC ELEMENT, AND ELECTRONIC APPARATUS

BACKGROUND OF THE INVENTION

1. Field of the Invention

The present invention relates to a piezoelectric material, in particular, to a lead-free piezoelectric material. The present invention also relates to a piezoelectric element, a multilayered piezoelectric element, a liquid discharge head, a liquid discharge apparatus, an ultrasonic motor, an optical apparatus, a vibratory apparatus, a dust removing apparatus, an image pickup apparatus, and an electronic apparatus that each include such a piezoelectric material.

2. Description of the Related Art

Lead zirconate titanate, which contains lead, is a typical piezoelectric material and is used in various piezoelectric devices such as actuators, oscillators, sensors, and filters. After such piezoelectric devices are discarded, the lead component of the piezoelectric material may migrate into the soil, causing harmful effects on the ecosystem. For this reason, in order to provide lead-free piezoelectric devices, lead-free piezoelectric materials are being intensively studied.

It is required that the piezoelectric performance of piezoelectric elements used in products such as household appliances does not considerably vary within the operation temperature ranges of the products. When parameters relating to piezoelectric performance, such as an electromechanical coupling factor, a dielectric constant, a Young's modulus, a piezoelectric constant, a mechanical quality factor, and a resonance frequency, considerably vary (for example, by 30% or more) in response to changes in temperature, stable element performance within the operation temperature ranges is difficult to provide. During phase transition of piezoelectric materials, the piezoelectricity becomes maximum at the phase transition temperatures. Thus, phase transition is the largest factor that causes variations in the piezoelectric performance. Accordingly, when stable piezoelectric performance within the operation temperature ranges of products is intended, piezoelectric materials that do not have phase transition temperatures within the operation temperature ranges are required.

Piezoelectric compositions used in resonant devices such as ultrasonic motors desirably have a high mechanical quality factor, which represents the degree of resonance sharpness. When the mechanical quality factor is low, a high power is required for operation or the piezoelectric element generates heat and driving thereof becomes difficult to control. For these reasons, there have been demands for piezoelectric materials having a high mechanical quality factor.

Japanese Patent Laid-Open No. 2009-215111 (hereafter Patent document 1) discloses a material represented as a pseudo-binary solid solution $\{[(Ba_{1-x1}M1_{x1})((Ti_{1-x}Zr_x)_{1-y1}N1_{y1})O_3]-\delta\%\ [(Ba_{1-y}Ca_y)_{1-x2}M2_{x2})(Ti_{1-y2}N2_{y2})O_3]\}$ (M1, N1, M2, and N2 are added elements). $(Ba_{1-x1}M1_{x1})((Ti_{1-x}Zr_x)_{1-y1}N1_{y1})O_3$ forms a rhombohedral crystal. $(Ba_{1-y}Ca_y)_{1-x2}M2_{x2})(Ti_{1-y2}N2_{y2})O_3$ forms a tetragonal crystal. By dissolving, in each other, two components having different crystal systems, the temperature of phase transition between the rhombohedral crystal and the tetragonal crystal is adjusted to be about room temperature. Patent document 1 discloses that, for example, $BaTi_{0.8}Zr_{0.2}O_3-50\%\ Ba_{0.7}Ca_{0.3}TiO_3$ has a phase transition temperature that is about room temperature and has at 20° C. a piezoelectric constant $d_{33}$ of 584 pC/N and at 70° C. 368 pC/N. That is, compared with the piezoelectric constant $d_{33}$ at 20° C., a 40° C. increase in the temperature results in a 37% decrease in the piezoelectric constant $d_{33}$. The piezoelectric material of Patent document 1 undergoes, at room temperature, phase transition at which piezoelectricity becomes maximum and hence has high piezoelectric performance at about room temperature; however, the piezoelectric performance of the piezoelectric material considerably varies in response to changes in temperature. In the piezoelectric material, the Zr proportion (x) in $(Ba_{1-x1}M1_{x1})((Ti_{1-x}Zr_x)_{1-y1}N1_{y1})O_3$ serving as an end member is set to be more than 0.1 to form a rhombohedral crystal.

Karaki, 15th US-Japan Seminar on Dielectric and Piezoelectric Ceramics Extended Abstract, p. 40 to 41 discloses a piezoelectric ceramic obtained by firing, by two-step sintering process, $BaTiO_3$ mixed with 0.03 parts by weight of Mn and 0 to 0.3 parts by weight of $LiBiO_2$. As a result of addition of $LiBiO_2$, the coercive electric field of $BaTiO_3$ mixed with 0.03 parts by weight of Mn substantially linearly increases with the amount of $LiBiO_2$ added and the piezoelectric constant $d_{33}$, dielectric constant, and dielectric loss tangent of $BaTiO_3$ similarly decrease. When 0.17 parts by weight of $LiBiO_2$ is added, the piezoelectric constant $d_{33}$ is 243 pC/N and the coercive electric field is 0.3 kV/mm. When 0.3 parts by weight of $LiBiO_2$ is added, the coercive electric field is 0.5 kV/mm. However, the inventor of the present invention performed thorough studies and, as a result, has found that this piezoelectric material undergoes phase transition between a rhombohedral crystal and a tetragonal crystal within the temperature range of 5° C. to −30° C.; and the piezoelectric material has a low mechanical quality factor of less than 500 at room temperature.

The existing techniques are disadvantageous in that the piezoelectric performance of piezoelectric ceramics considerably varies within the operation temperature ranges of piezoelectric elements, and the piezoelectric ceramics have a low mechanical quality factor.

The present invention provides a piezoelectric material that does not contain lead, that does not undergo phase transition within the operation temperature range, and that has a high density, a high mechanical quality factor, and good piezoelectric properties. The present invention also provides a piezoelectric element, a multilayered piezoelectric element, a liquid discharge head, a liquid discharge apparatus, an ultrasonic motor, an optical apparatus, a vibratory apparatus, a dust removing apparatus, an image pickup apparatus, and an electronic apparatus that each include the piezoelectric material.

SUMMARY OF THE INVENTION

The present invention provides a piezoelectric material including a main component containing a perovskite-type metal oxide represented by a general formula (1) below; Mn as a first subcomponent; Li as a second subcomponent; and Bi as a third subcomponent, wherein a Mn content relative to 100 parts by weight of the metal oxide is 0.04 parts by weight or more and 0.36 parts by weight or less on a metal basis, a Li content α relative to 100 parts by weight of the metal oxide is 0.0013 parts by weight or more and 0.0280 parts by weight or less on a metal basis, a Bi content β relative to 100 parts by weight of the metal oxide is 0.042 parts by weight or more and 0.850 parts by weight or less on a metal basis, and the contents α and β satisfy $0.5 \leq (\alpha \cdot MB)/(\beta \cdot ML) \leq 1$ (where ML represents an atomic weight of Li and MB represents an atomic weight of Bi)

$$(Ba_{1-x}Ca_x)_a(Ti_{1-y-z}Zr_ySn_z)O_3 \qquad (1)$$

(where x, y, z, and a satisfy 0.09≤x≤0.30, 0.025≤y≤0.074, 0≤z≤0.02, and 0.986≤a≤1.02).

Further features of the present invention will become apparent from the following description of exemplary embodiments with reference to the attached drawings.

BRIEF DESCRIPTION OF THE DRAWINGS

FIGS. 11A and 11B are schematic views illustrating the vibration principle of a dust removing apparatus according to an embodiment of the present invention.

DESCRIPTION OF THE EMBODIMENTS

Figure 1:
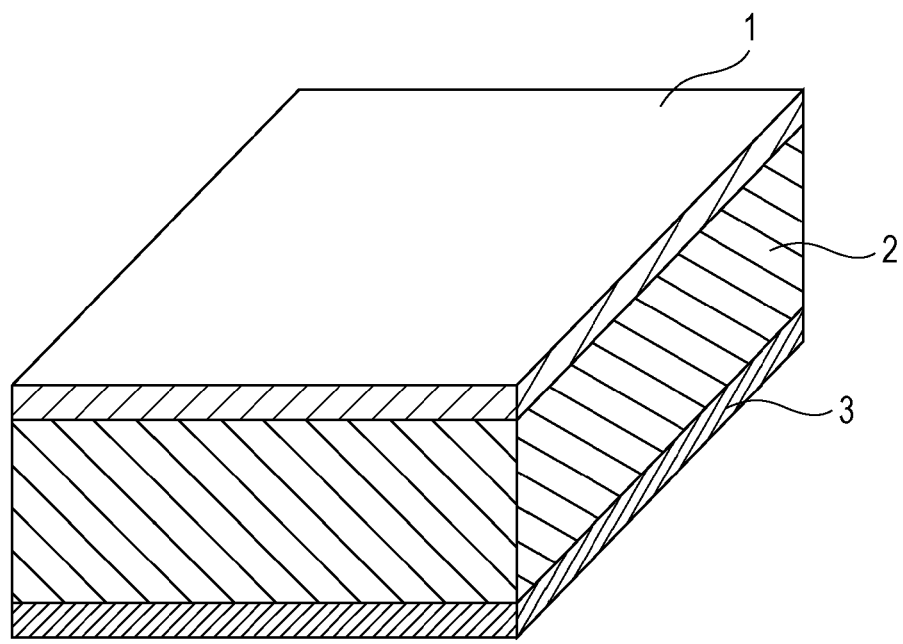
FIG. 1 is a schematic view illustrating the configuration of a piezoelectric element according to an embodiment of the present invention.

Hereinafter, embodiments of the present invention will be described.

The present invention provides a lead-free piezoelectric material that contains $(Ba,Ca)(Ti,Zr,Sn)O_3$ as a main component, that has a high density and a high mechanical quality factor, that does not undergo phase transition within the operation temperature range, and that have good piezoelectric properties and insulation properties. Such a piezoelectric material according to an embodiment of the present invention has dielectric characteristics and hence can be used in various applications such as memories and sensors.

A piezoelectric material according to an embodiment of the present invention includes a main component containing a perovskite-type metal oxide represented by a general formula (1) below; Mn as a first subcomponent; Li as a second subcomponent; and Bi as a third subcomponent, wherein a Mn content relative to 100 parts by weight of the metal oxide is 0.04 parts by weight or more and 0.36 parts by weight or less on a metal basis, a Li content α relative to 100 parts by weight of the metal oxide is 0.0013 parts by weight or more and 0.0280 parts by weight or less on a metal basis, a Bi content β relative to 100 parts by weight of the metal oxide is 0.042 parts by weight or more and 0.850 parts by weight or less on a metal basis, and the contents α and β satisfy 0.5≤ (α·MB)/(β·ML)≤1 (where ML represents an atomic weight of Li and MB represents an atomic weight of Bi)

$$(Ba_{1-x}Ca_x)_a(Ti_{1-y-z}Zr_ySn_z)O_3 \qquad (1)$$

(where x, y, z, and a satisfy 0.09≤x≤0.30, 0.025≤y≤0.074, 0≤z≤0.02, and 0.986≤a≤1.02).

Perovskite-type metal oxide represented by the formula (1) is contained as a main component in the piezoelectric material.

The term "perovskite-type metal oxide" used herein denotes a metal oxide having a perovskite-type structure (also referred to as perovskite structure) as described in the 5th edition of Iwanami Dictionary of Physics and Chemistry (published by Iwanami Shoten, Publishers, Feb. 20, 1998). In general, a metal oxide having a perovskite-type structure is represented by a chemical formula $ABO_3$. In a perovskite-type metal oxide, elements A and B are present as ions and occupy specific sites (A-site and B-site) of a unit cell. For example, in the case of a cubic unit cell, elements A are located at the vertexes of the cube and element B is located at the body center of the cube. Elements O present as oxygen anions occupy the face centers of the cube. In the above description, the "perovskite-type metal oxide represented by the formula (1) is contained as a main component" means that the main component for expressing the piezoelectric properties is the perovskite-type metal oxide represented by the formula (1). For example, the piezoelectric material may contain a component for adjusting properties thereof, such as manganese mentioned above, or impurities introduced during the manufacturing.

A piezoelectric material according to an embodiment of the present invention contains a perovskite-type metal oxide as a main phase from the viewpoint of insulation properties. Whether a perovskite-type metal oxide constitutes a main phase or not can be determined on the basis of, for example, measurement of the piezoelectric material by X-ray diffractometry in terms of whether the maximum diffraction intensity derived from the perovskite-type metal oxide is 100 times or more the maximum diffraction intensity derived from the impurity phase or not. When such a piezoelectric material is composed of a perovskite-type metal oxide alone, it has the maximum insulating properties. The term "main phase" means that a piezoelectric material is measured by powder X-ray diffractometry and a peak having the highest diffraction intensity is derived from a perovskite-type structure. The piezoelectric material can have a "single phase" structure, that is, the piezoelectric material can be substantially entirely constituted by perovskite-type crystals.

In the metal oxide represented by the general formula (1), the metal elements located at A-sites are Ba and Ca and the metal elements located at B-sites are Ti, Zr, and Sn. Some Ba and Ca ions may be located at B-sites. Similarly, some of Ti and Zr ions may be located at A-sites. When Sn ions are located at A-sites, piezoelectric properties may be degraded.

In the general formula (1), the molar ratio of the B-site elements to O element is 1:3. However, the present invention also encompasses cases where this element molar ratio is slightly deviated from 1:3 (for example, in the range of 1.00:2.94 to 1.00:3.06) as long as the metal oxide has a perovskite-type structure as a main phase.

The form of a piezoelectric material according to an embodiment of the present invention is not limited and may be any form such as ceramic, powder, single crystal, film, or slurry. The piezoelectric material can have the form of ceramic. The term "ceramic" used herein denotes an aggregate (also referred to as bulk) of crystal grains that are mainly formed of metal oxide and are sintered by a heat treatment, that is, a polycrystal. The term "ceramic" also denotes a polycrystal that has been processed after sintering.

In the general formula (1), the Ca proportion x satisfies $0.09 \leq x \leq 0.30$. When the Ca proportion x is less than 0.09 and the Zr proportion y is 0.025 or more, the temperature (hereafter $T_{to}$) of phase transition from a tetragonal crystal to an orthorhombic crystal is more than −10° C. Although addition of Li and Bi components can decrease $T_{to}$, addition of large amounts Li and Bi is not desirable.

As the Zr proportion y and the Sn proportion z increase, $T_{to}$ increases. However, as long as the Ca proportion x is 0.09 or more, irrespective of the Zr proportion y and the Sn proportion z that are within the above-described ranges, addition of Li and Bi components can decrease $T_{to}$ to −30° C. or less. When the proportion x is more than 0.3, Ca does not dissolve in solid at a sintering temperature of 1400° C. or less; and $CaTiO_3$ serving as an impurity phase is generated and the piezoelectric performance is degraded. Accordingly, in order to decrease $T_{to}$ to −10° C. or less with minimum addition of Li and Bi components and in order to suppress generation of $CaTiO_3$ causing a decrease in piezoelectricity, the proportion x satisfies $0.09 \leq x \leq 0.30$ ($BaTiO_3$ forms a tetragonal crystal at room temperature. When $BaTiO_3$ at room temperature is cooled, it undergoes phase transition at $T_{to}$ to an orthorhombic crystal. When $BaTiO_3$ forming an orthorhombic crystal is heated, it undergoes phase transition from the orthorhombic crystal to a tetragonal crystal. The temperature of this phase transition is defined as $T_{ot}$ in the Specification. $T_{to}$ and $T_{ot}$ satisfy $T_{to} < T_{ot}$). When the Ca proportion x is 0.12 or more, addition of Li and Bi components can decrease the phase transition temperature to −40° C. or less. As a result, temperature dependency of piezoelectricity within the operation temperature range can be reduced. In summary, the Ca proportion x preferably satisfies $0.12 \leq x \leq 0.30$.

The Zr proportion y satisfies $0.025 \leq y \leq 0.074$. When the Zr proportion y is less than 0.025, piezoelectricity is decreased. When the Zr proportion y is more than 0.074, the Curie temperature (hereafter $T_C$) may be less than 100° C. In order to achieve good piezoelectric properties and in order to set $T_C$ to be 100° C. or more, y satisfies $0.025 \leq y \leq 0.074$.

A Zr proportion y of 0.04 or more results in a high dielectric constant at room temperature to further increase piezoelectricity. Accordingly, the Zr proportion y preferably satisfies $0.04 \leq y \leq 0.074$.

The Sn proportion z satisfies $z \leq 0.02$. Zr and Sn are added for the purpose of increasing the relative dielectric constant of the piezoelectric material. However, substitution of Zr or Sn for Ti also increases $T_{to}$ of a piezoelectric material of the embodiment. $T_{to}$ present within the operation temperature range increases the temperature dependency of piezoelectric performance, which is not desirable. Accordingly, the increment of $T_{to}$ due to the addition of Zr or Sn is cancelled out by addition of Ca, which has the effect of decreasing $T_{to}$. Increment of $T_{to}$ is lower in the case of substitution of Sn for Ti than in the case of substitution of Zr for Ti. In $BaTiO_3$, substitution of Zr for 1% of Ti results in an increase of $T_{to}$ by 12° C., whereas substitution of Sn for 1% of Ti results in an increase of $T_{to}$ by 5° C. Thus, substitution of Sn for Ti requires less amount of Ca. When the piezoelectric material has a low content of Ca, it has a high mechanical quality factor. Accordingly, the Sn proportion z is set to satisfy $z \leq 0.02$. When the proportion z satisfies $z > 0.02$, depending on the Zr proportion, $T_C$ may become less than 100° C., which is not desirable.

A ratio a of the total number of moles of Ba and Ca to the total number of moles of Zr, Ti, and Sn, that is, $a = (Ba+Ca)/(Zr+Ti+Sn)$ satisfies $0.986 \leq a \leq 1.02$. When the ratio a is less than 0.986, abnormal grain growth occurs during firing. The average grain size becomes 50 µm or more and the mechanical strength and electromechanical coupling factor of the material become low. When the ratio a is more than 1.02, a piezoelectric material having a high density is not obtained. A piezoelectric material having a low density has a low piezoelectricity. In the embodiment, a sample that is not sufficiently fired has an at least 5% lower density than a high-density sample that is sufficiently fired. In order to obtain a piezoelectric material that has a high density and a high mechanical strength, the ratio a is set to satisfy $0.986 \leq a \leq 1.02$.

The piezoelectric material of the embodiment contains Mn as a first subcomponent. The Mn content relative to 100 parts by weight of the perovskite-type metal oxide represented by the general formula (1) is 0.04 parts by weight or more and 0.36 parts by weight or less on a metal basis. When the Mn content satisfies this range, the mechanical quality factor is increased. When the Mn content is less than 0.04 parts by weight, the effect of increasing the mechanical quality factor is not obtained. On the other hand, when the Mn content is more than 0.36 parts by weight, the insulation resistance of the piezoelectric material is decreased. When the piezoelectric material has a low insulation resistance, the dielectric loss tangent of the piezoelectric material measured with an impedance analyzer under application of an alternating current electric field having a frequency of 1 kHz and an electric field intensity of 10 V/cm at room temperature is more than 0.01; or the resistivity is 1 GΩcm or less.

Mn desirably occupies B-sites. In general, Mn has a valence of 4+, 2+, or 3+. In the case where conduction electrons are present in the crystal (for example, oxygen defects are present in the crystal or a donor element occupies A-sites), a decrease in the valence of Mn from 4+ to 3+ or 2+ allows trapping of conduction electrons to increase the insulation resistance.

When Mn has a valence of less than 4+, such as 2+, Mn serves as an acceptor. When Mn is present as an acceptor in a perovskite structure crystal, holes are generated in the crystal or oxygen vacancies are formed in the crystal.

When most of Mn ions added have a valence of 2+ or 3+, introduction of oxygen vacancies does not sufficiently compensate for holes and the insulation resistance is decreased. Accordingly, most of Mn ions desirably have a valence of 4+. However, a very small number of Mn ions may have a valence of less than 4+ to serve as an acceptor, occupy B-sites of the perovskite structure, and cause formation of oxygen vacancies. This is because Mn ions having a valence of 2+ or 3+ and oxygen vacancies form defect dipoles to thereby increase the mechanical quality factor of the piezoelectric material. When trivalent Bi ions occupy A-sites, in order to maintain the balance in terms of charge, Mn ions tend to have a valence lower than 4+.

The valence of Mn added in a very small amount to a nonmagnetic (diamagnetic) substance can be evaluated by measuring the temperature dependency of magnetic susceptibility. The magnetic susceptibility can be measured by a superconducting quantum interference device (SQUID), a vibrating sample magnetometer (VSM), or a magnetic balance. In general, the magnetic susceptibility $\chi$ obtained by the measurement follows Curie-Weiss law represented by a formula (2):

$$\chi = C/(T-\theta) \qquad (2)$$

where C represents the Curie constant and $\theta$ represents the paramagnetic Curie temperature.

In general, when Mn added in a very small amount to a nonmagnetic substance has a valence of 2+, it has a spin S of 5/2; when Mn has a valence of 3+, it has a spin S of 2; and when Mn has a valence of 4+, it has a spin S of 3/2. The Curie constant C converted in terms of Mn unit amount corresponds to the spin values S of Mn having the valences. Accordingly, by obtaining the Curie constant C from the temperature dependency of the magnetic susceptibility $\chi$, the valence of Mn can be evaluated.

For evaluation of the Curie constant C, the temperature dependency of the magnetic susceptibility is desirably measured from a temperature as low as possible. This is because the amount of Mn is very small and hence the magnetic susceptibility at a relatively high temperature, for example, around room temperature, is very small and is difficult to measure. The Curie constant C can be obtained in the following manner: the reciprocal of magnetic susceptibility, $1/\chi$, is plotted with respect to temperature T; the plots are subjected to linear approximation; and the gradient of the resultant line is determined as the Curie constant C.

The piezoelectric material of the embodiment contains Li as a second subcomponent and Bi as a third subcomponent. The Li content ($\alpha$) relative to 100 parts by weight of the perovskite-type metal oxide represented by the general formula (1) is 0.0013 parts by weight or more and 0.0280 parts by weight or less on a metal basis. The Bi content ($\beta$) relative to 100 parts by weight of the perovskite-type metal oxide represented by the general formula (1) is 0.042 parts by weight or more and 0.850 parts by weight or less on a metal basis. The Li content $\alpha$ and the Bi content $\beta$ satisfy the relationship of a formula (1):

$$0.5 \leq (\alpha \cdot MB)/(\beta \cdot ML) \leq 1 \qquad (1)$$

where ML represents the atomic weight of Li and MB represents the atomic weight of Bi.

When the Li content is less than 0.0013 parts by weight and the Bi content is less than 0.042 parts by weight, the effect of decreasing the phase transition temperature and increasing the mechanical quality factor is not obtained. When the Li content is more than 0.0280 parts by weight and the Bi content is more than 0.850 parts by weight, the electromechanical coupling factor is decreased by more than 30%, compared with the case where Li and Bi are not added. When the Li—Bi molar ratio ($\alpha \cdot MB$)/($\beta \cdot ML$) is less than 0.5, the Curie temperature is decreased, which is not desirable. When the Li—Bi molar ratio ($\alpha \cdot MB$)/($\beta \cdot ML$) is more than 1, the dielectric loss tangent is increased. When Li and Bi are present so as to satisfy the formula (1), while the Curie temperature is not decreased and the insulation resistance is not decreased, $T_{to}$ and $T_{ot}$ can be decreased and the mechanical quality factor can be increased.

Portions of Li and Bi added may be present in grain boundaries or may dissolve in the perovskite-type structure of (Ba, Ca)(Ti,Zr,Sn)O$_3$. Li and Bi may have the form of (Li$_{0.5}$Bi$_{0.5}$)$^{2+}$ and occupy A-sites. Li and Bi may serve as acceptors and occupy tetravalent B-sites.

When Li and Bi are present in grain boundaries, friction between grains is reduced and the mechanical quality factor is increased. When Li and Bi dissolve in the perovskite structure of (Ba,Ca)(Ti,Zr,Sn)O$_3$, $T_{ot}$ and $T_{to}$ can be decreased and the mechanical quality factor can be further increased.

The locations of Li and Bi can be determined by, for example, X-ray diffractometry, electron beam diffractometry, electron microscopy, or laser ablation ICP-MS.

When Li and Bi occupy B-sites, since Li and Bi have a larger ion radius than Ti and Zr, the lattice constant of the perovskite structure is increased.

When Li and Bi occupy A-sites, the value a that is optimal for providing a high-density ceramic by firing is decreased. In the BaO—TiO$_2$ phase diagram, the TiO$_2$-rich region with respect to the composition where BaO and TiO$_2$ have a molar ratio of 1:1 has a liquid phase in high temperatures. Accordingly, during firing of BaTiO$_3$ ceramic, when the TiO$_2$ content is more than the stoichiometric ratio, the liquid phase is sintered to cause abnormal grain growth. On the other hand, when the BaO content is high, sintering is less likely to proceed and the resultant ceramic has a low density. Although LiBiO$_2$ is known as a sintering aid, Li and Bi components occupy A-sites to provide excessive amounts of A-site components and sintering of ceramic may be suppressed. As a result, the resultant ceramic has a low density. In such a case, by decreasing the value a, sintering can be promoted and a high-density sample can be obtained.

The Li content, the Bi content, and a Li—Bi content ratio can be evaluated by, for example, ICP analysis.

For the purpose of facilitating production of the piezoelectric material of the embodiment and adjusting properties of the piezoelectric material of the embodiment, 5 mol % or less of Ba and Ca may be substituted by a divalent metal element such as Sr. Similarly, 5 mol % or less of Ti, Zr, and Sn may be substituted by a tetravalent metal element such as Hf.

The density of a sintered body can be measured by, for example, Archimedes' method. In the embodiment, when the ratio of the measured density ($\rho_{meas.}$) of the sintered body and the theoretical density ($\rho_{calc.}$) determined from the composition and lattice constant of the sintered body, that is, the relative density (100 $\rho_{calc.}/\rho_{meas.}$) is 95 or more, the sintered body is regarded as having a sufficiently high density as a piezoelectric material.

The Curie temperature $T_C$ is as follows: a piezoelectric material loses piezoelectricity at the Curie temperature $T_C$ or more. In the Specification, a temperature that is close to the temperature of phase transition between a ferroelectric phase (tetragonal crystal phase) and a paraelectric phase (cubic crystal phase) and at which the dielectric constant becomes maximum is defined as $T_C$. The dielectric constant is measured with, for example, an impedance analyzer under application of an alternating current electric field having a frequency of 1 kHz and an electric field intensity of 10 V/cm.

As the temperature increases from a low temperature, the piezoelectric material of the embodiment undergoes successive phase transitions from a rhombohedral crystal, an orthorhombic crystal, a tetragonal crystal, a cubic crystal, to a hexagonal crystal. The phase transition referred to in the Specification denotes only a phase transition from an orthorhombic crystal to a tetragonal crystal or from a tetragonal crystal to an orthorhombic crystal. The phase transition temperature can be evaluated in the same measurement method as in the Curie temperature and the temperature at which the dielectric constant becomes maximum is defined as the phase transition temperature. The crystal system can be evaluated by, for example, X-ray diffractometry, electron beam diffractometry, or Raman spectroscopic analysis.

One of the causes that decrease the mechanical quality factor is domain wall vibration. In general, the more complicated a domain structure, the higher the density of domain walls and the lower the mechanical quality factor. The crystal orientations of spontaneous polarization of an orthorhombic perovskite structure and a tetragonal perovskite structure are respectively, in pseudo-cubic representations, <110> and <100>. That is, the degree of spatial freedom of spontaneous polarization is lower in the tetragonal structure than in the orthorhombic structure. Accordingly, the tetragonal structure has a simpler domain structure and, even in the case of the same composition, it has a higher mechanical quality factor. Thus, the piezoelectric material of the embodiment desirably has a tetragonal structure rather than an orthorhombic structure within the operation temperature range.

At a temperature around the phase transition temperature, the dielectric constant and electromechanical coupling factor become maximum and the Young's modulus becomes minimum. The piezoelectric constant is a function of these three parameters and has a maximum value or a point of inflection at a temperature around the phase transition temperature. Accordingly, when phase transition occurs within the operation temperature range of a device, the performance of the device excessively varies in response to changes in temperature or the resonance frequency varies in response to changes in temperature to cause difficulties in control of the device. In summary, it is desirable that phase transition, which is the largest factor that causes variations in the piezoelectric performance, does not occur within the operation temperature range. The farther the phase transition temperature from the operation temperature range, the less the temperature dependency of the piezoelectric performance within the operation temperature range, which is desirable.

The piezoelectric material of the embodiment can contain a fourth subcomponent containing at least one of Si and B. The content of the fourth subcomponent relative to 100 parts by weight of the metal oxide represented by the general formula (1) can be 0.001 parts by weight or more and 4.000 parts by weight or less on a metal basis. The fourth subcomponent has an effect of decreasing the sintering temperature of the piezoelectric material of the embodiment. When the piezoelectric material is used for a multilayered piezoelectric element, in the manufacturing process of the multilayered piezoelectric element, the piezoelectric material is sintered together with an electrode material. In general, electrode materials have a lower heat resistance temperature than piezoelectric materials. Accordingly, when the sintering temperature for the piezoelectric material can be decreased, energy required for sintering is reduced and the number of choices of electrode materials is increased, which are desirable.

When the fourth subcomponent content is less than 0.001 parts by weight, the effect of decreasing the sintering temperature is not provided. When the fourth subcomponent content is more than 4.000 parts by weight, this sample has an at least 30% lower piezoelectricity than a sample that does not contain the fourth subcomponent and is obtained by firing under optimal conditions (for example, firing in the air at 1300° C. to 1350° C.). When the fourth subcomponent content is 0.001 parts by weight or more and 4.000 parts by weight or less, a decrease in the piezoelectricity can be suppressed to less than 30% and the sintering temperature can be decreased. In particular, when the fourth subcomponent content is 0.05 parts by weight or more, a high density ceramic can be provided by firing at a sintering temperature lower than 1250° C., which is more desirable. When the fourth subcomponent content is 0.09 parts by weight or more and 0.15 parts by weight or less, firing can be performed at 1200° C. or less and a decrease in the piezoelectricity can be suppressed to 20% or less, which is still more desirable.

In the piezoelectric material of the embodiment, $\alpha$ and $\beta$ can satisfy $0.19 < 2.15\alpha + 1.11\beta < 1$. Compared with a case where $\alpha$ and $\beta$ do not satisfy this relationship, when $\alpha$ and $\beta$ satisfy this relationship, the piezoelectric material has a high mechanical quality factor.

The piezoelectric material of the embodiment can satisfy $y+z \leq (11x/14) - 0.037$ in the general formula (1). When x, y, and z satisfy this relationship, $T_{to}$ becomes lower than $-20°$ C.

The piezoelectric material of the embodiment desirably does not have a phase transition temperature in the range of $-60°$ C. or more and $100°$ C. or less. When the piezoelectric material does not have a phase transition temperature in this range, it is less likely to undergo characteristic fluctuations at the operation temperatures.

A manufacturing method for the piezoelectric material of the embodiment is not particularly limited.

When a piezoelectric ceramic is manufactured, a standard method of sintering a solid powder containing, for example, an oxide, a carbonate, a nitrate, and an oxalate that contain constituent elements at normal pressure can be employed. These raw materials include metal compounds such as a Ba compound, a Ca compound, a Ti compound, a Zr compound, a Sn compound, a Mn compound, a Li compound, and a Bi compound.

Examples of the Ba compound usable include barium oxide, barium carbonate, barium oxalate, barium acetate, barium nitrate, barium titanate, barium zirconate, and barium zirconate titanate.

Examples of the Ca compound usable include calcium oxide, calcium carbonate, calcium oxalate, calcium acetate, calcium titanate, and calcium zirconate.

Examples of the Ti compound usable include titanium oxide, barium titanate, barium zirconate titanate, and calcium titanate.

Examples of the Zr compound usable include zirconium oxide, barium zirconate, barium zirconate titanate, and calcium zirconate.

Examples of the Sn compound usable include tin oxide, barium stannate, and calcium stannate.

Examples of the Mn compound usable include manganese carbonate, manganese monoxide, manganese dioxide, tetramanganese trioxide, and manganese acetate.

Examples of the Li compound usable include lithium carbonate and lithium bismuthate.

Examples of the Bi compound usable include bismuth oxide and lithium bismuthate.

A material used for adjusting the molar ratio a of the content of Ba and Ca at A-sites to the content of Ti, Zr, and Sn at B-sites in the piezoelectric ceramic of the embodiment is not particularly limited. Ba compounds, Ca compounds, Ti compounds, Zr compounds, and Sn compounds provide the same effect.

A method for granulating a raw material powder of the piezoelectric ceramic of the embodiment is not particularly limited. Examples of a binder usable in the granulation include PVA (polyvinyl alcohol), PVB (polyvinyl butyral), and acrylic resins. The amount of the binder added is preferably 1 part by weight to 10 parts by weight, more preferably 2 parts by weight to 5 parts by weight in view of an increase in the density of the compact. A powder mixture obtained by mechanically mixing a Ba compound, a Ca compound, a Ti compound, a Zr compound, a Sn compound, and a Mn compound may be granulated; these compounds may be calcined at about 800° C. to about 1300° C. and subsequently granulated; or a Ba compound, a Ca compound, a Ti compound, a Zr compound, a Sn compound, a Li compound, and a Bi compound may be calcined and, to these calcined compounds, a Mn compound and a binder may be simultaneously added. The most desirable granulation method is a spray dry method because the particle size of a granulated powder can be made more uniform.

A method for forming a compact of the piezoelectric ceramic of the embodiment is not particularly limited. The compact is a solid body formed of a raw material powder, a granulated powder, or a slurry. The compact can be formed by, for example, uniaxial pressing, cold isostatic pressing, hot isostatic pressing, casting, or extrusion.

A method for sintering the piezoelectric ceramic of the embodiment is not particularly limited. The sintering can be performed by, for example, sintering with an electric furnace, sintering with a gas furnace, electric heating, microwave sintering, millimeter wave sintering, or HIP (hot isostatic pressing). The sintering with an electric furnace and the sintering with a gas furnace may be performed with a continuous furnace or a batch furnace.

In the sintering methods, the ceramic sintering temperature is not particularly limited. The ceramic sintering temperature is desirably a temperature at which compounds react and crystals sufficiently grow. The sintering temperature is preferably, from the viewpoint of providing ceramic grains having a grain size of 3 µm to 30 µm, 1100° C. or more and 1550° C. or less, and more preferably 1100° C. or more and 1380° C. or less. A piezoelectric ceramic obtained by sintering in such a temperature range has good piezoelectric performance.

In order to stabilize properties of a piezoelectric ceramic obtained by sintering with high reproducibility, sintering can be performed at a constant temperature within the above-described range for 2 hours or more and 24 hours or less. A sintering method such as a two-step sintering method may be used. However, from the viewpoint of productivity, a sintering method that does not involve sharp temperature change can be used.

After the piezoelectric ceramic is polished, it can be heat-treated at a temperature of 1000° C. or more. When a piezoelectric ceramic is mechanically polished, residual stress is generated in the piezoelectric ceramic. By heat-treating this piezoelectric ceramic at 1000° C. or more, the residual stress is reduced and the piezoelectric properties of the piezoelectric ceramic are enhanced. This heat treatment also eliminates a raw material powder of barium carbonate or the like deposited in grain boundaries. The time for the heat treatment is not particularly limited and can be an hour or more.

When the piezoelectric material of the embodiment has a crystal grain size of more than 100 µm, the material may have a strength insufficient for cutting and polishing. When the grain size is less than 0.3 µm, the piezoelectricity is decreased. In summary, the grain size is preferably on average 0.3 µm or more and 100 µm or less, more preferably 3 µm or more and 30 µm or less.

The term "grain size" used herein denotes "projected area circular equivalent diameter" commonly referred to in microscopy, that is, the diameter of a perfect circle having the same area as the projected area of a crystal grain. In the embodiment, the method for measuring the grain size is not particularly limited. For example, the surface of the piezoelectric material is photographed with a polarizing microscope or a scanning electron microscope; and the obtained micrograph is subjected to image processing and the grain size is determined. Since optimal magnifications are different depending on target grain sizes, selection from an optical microscope and an electron microscope may be performed for a target grain size. Instead of an image of the surface of the material, the circular equivalent diameter may be determined from an image of a polished surface or a section of the material.

When the piezoelectric material of the embodiment is used as a film formed on a substrate, the piezoelectric material preferably has a thickness of 200 nm or more and 10 µm or less, more preferably 300 nm or more and 3 µm or less. This is because a piezoelectric material having a film thickness of 200 nm or more and 10 µm or less has a sufficient electromechanical transduction function as a piezoelectric element.

The method for forming the film is not particularly limited. Examples of the film formation method include chemical solution deposition (CSD), a sol-gel method, metal organic chemical vapor deposition (MOCVD), sputtering method, pulse laser deposition (PLD), a hydrothermal synthesis method, and aerosol deposition (AD). Of these, the most preferred film formation methods are chemical solution deposition and sputtering. Chemical solution deposition or sputtering method allows easy formation of a film having a large area. A substrate used for the piezoelectric material of the embodiment is desirably a single crystal substrate that is provided by cutting along a (001) plane or a (110) plane and polished. By using a single crystal substrate that is provided by cutting along a specific crystal plane and polished, a piezoelectric material film formed on a surface of the substrate can be made to be strongly oriented in the same direction as in the substrate.

Hereinafter, a piezoelectric element including a piezoelectric material according to an embodiment of the present invention will be described.

FIG. 1 is a schematic view illustrating the configuration of a piezoelectric element according to an embodiment of the present invention. The piezoelectric element of the embodiment at least includes a first electrode 1, a piezoelectric material 2, and a second electrode 3. The piezoelectric material 2 is a piezoelectric material according to an embodiment of the present invention.

When the piezoelectric material of the embodiment is used to form a piezoelectric element at least including the first electrode and the second electrode, piezoelectric properties of the piezoelectric material can be evaluated. The first electrode and the second electrode are conductive layers each having a thickness of about 5 nm to about 2000 nm. The material of the electrodes is not particularly limited and may be selected from materials generally used for piezoelectric elements. Examples of the materials include metals such as Ti, Pt, Ta, Ir, Sr, In, Sn, Au, Al, Fe, Cr, Ni, Pd, Ag, and Cu, and compounds of these metals.

The first electrode and the second electrode may be formed of a single material selected from the examples. Alternatively, each electrode may be constituted by stacked layers of two or more materials selected from the examples. The first electrode may be formed of a material different from that of the second electrode.

The method for forming the first electrode and the second electrode is not limited. The first electrode and the second electrode may be formed by, for example, baking of metal paste, sputtering, or a vapor deposition method. The first electrode and the second electrode may be used after being patterned so as to have a desired shape.

The piezoelectric element can have polarization axes aligned in a certain direction. When the piezoelectric element has polarization axes aligned in a certain direction, it has a high piezoelectric constant.

The poling method for the piezoelectric element is not particularly limited. The poling process may be performed in the air or in oil. Although the temperature for the poling can be 60° C. to 130° C., optimal conditions somewhat vary in accordance with the composition of a piezoelectric material constituting the piezoelectric element. The electric field applied to the material for the poling process can have an intensity equal to or more than that of a coercive electric field of the material, specifically, 1 to 5 kV/mm.

The piezoelectric constant and electromechanical quality factor of the piezoelectric element can be calculated on the basis of standards of the Japan Electronics and Information Technology Industries Association (JEITA EM-4501) from measurement results of resonance frequency and antiresonance frequency obtained with a commercially available impedance analyzer. Hereafter, this method is referred to as a resonance-antiresonance method.

Hereinafter, a multilayered piezoelectric element including a piezoelectric material according to an embodiment of the present invention will be described.

Multilayered Piezoelectric Element

A multilayered piezoelectric element according to an embodiment of the present invention includes a piezoelectric material layer and an electrode layer including an internal electrode. The piezoelectric material layer and the electrode layer are alternately stacked. The piezoelectric material layer contains a piezoelectric material according to an embodiment of the present invention.

Figure 2A:
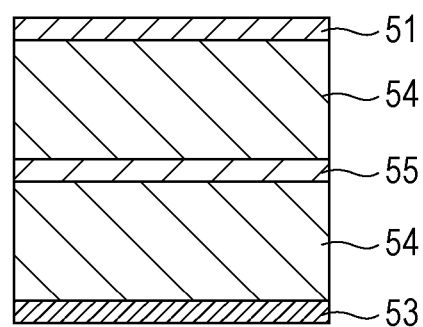
FIGS. 2A and 2B each include a schematic sectional view illustrating the configuration of a multilayered piezoelectric element according to an embodiment of the present invention.

FIG. 2A is a schematic sectional view illustrating the configuration of a multilayered piezoelectric element according to an embodiment of the present invention. The multilayered piezoelectric element of the embodiment includes piezoelectric material layers 54 and an electrode layer including an internal electrode 55. The piezoelectric material layers and the electrode layer are alternately stacked. The piezoelectric material layers 54 are formed of the above-described piezoelectric material. The multilayered piezoelectric element may include, in addition to the internal electrode 55, external electrodes such as a first electrode 51 and a second electrode 53.

Figure 2B:
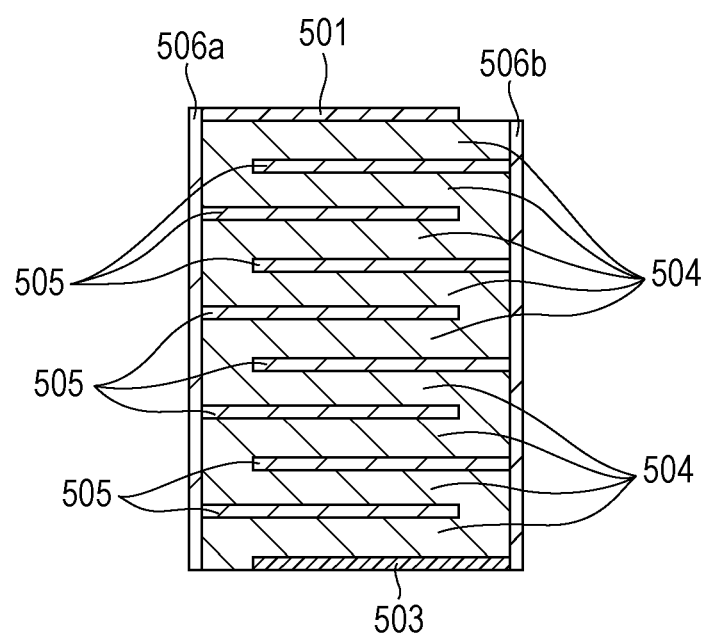

FIG. 2A illustrates the multilayered piezoelectric element of the embodiment having a configuration in which two layers of the piezoelectric material layer 54 and one layer of the internal electrode 55 are alternately stacked; and this layered structure is sandwiched between the first electrode 51 and the second electrode 53. As illustrated in FIG. 2B, the number of the piezoelectric material layer and the number of the internal electrode may be increased and the number of layers stacked is not limited. In FIG. 2B, the multilayered piezoelectric element has the following configuration: nine layers of a piezoelectric material layer 504 and eight layers of an internal electrode 505 are alternately stacked; this layered structure is sandwiched between a first electrode 501 and a second electrode 503; and external electrodes 506a and 506b are provided to short-circuit the internal electrodes alternately formed.

It is not necessary for the internal electrodes 55 and 505 and the external electrodes 506a and 506b to have the same sizes and shapes as the piezoelectric material layers 54 and 504.

The internal electrodes 55 and 505 and the external electrodes 506a and 506b may be divided into plural portions.

The internal electrodes 55 and 505 and the external electrodes 506a and 506b are each constituted by a conductive layer having a thickness of about 5 nm to about 2000 nm. The material of these electrodes is not particularly limited and may be selected from materials generally used for piezoelectric elements. Examples of the materials include metals such as Ti, Pt, Ta, Ir, Sr, In, Sn, Au, Al, Fe, Cr, Ni, Pd, Ag, and Cu and compounds of the metals. The internal electrodes 55 and 505 and the external electrodes 506a and 506b may be each formed of a single material selected from the examples, or a mixture or an alloy of two or more materials selected from the examples. Alternatively, each electrode may be constituted by stacked layers of two or more materials selected from the examples. Different electrodes may be formed of different materials. The internal electrodes 55 and 505 can include at least one of Ni and Cu because the electrode material is inexpensive. When the internal electrodes 55 and 505 are formed so as to include at least one of Ni and Cu, the multilayered piezoelectric element of the embodiment can be fired in a reducing atmosphere.

In the multilayered piezoelectric element according to an embodiment of the present invention, the internal electrode can contain Ag and Pd, and a weight ratio M1/M2 of a Ag weight content M1 to a Pd weight content M2 can satisfy $0.25 \leq M1/M2 \leq 4.0$. When the weight ratio M1/M2 is less than 0.25, the sintering temperature for the internal electrode is increased, which is not desirable. On the other hand, when the weight ratio M1/M2 is more than 4.0, the internal electrode is formed in an island pattern, that is, in a nonuniform configuration in the plane, which is not desirable. The weight ratio M1/M2 preferably satisfies $0.3 \leq M1/M2 \leq 3.0$.

As illustrated in FIG. 2B, plural electrode layers including the internal electrodes 505 may be short-circuited together for the purpose of making drive voltages be in phase. For example, a configuration in which the internal electrode 505, the first electrode 501, and the second electrode 503 are alternately short-circuited may be employed. The configuration of a short circuit between electrodes is not limited. An electrode or wiring for a short circuit may be provided on a side surface of the multilayered piezoelectric element; or a through-hole penetrating the piezoelectric material layers 504 may be provided and a conductive material is placed within the through-hole to short-circuit electrodes.

Liquid Discharge Head

A liquid discharge head according to an embodiment of the present invention at least includes a liquid chamber including a vibrating unit including the above-described piezoelectric element or the above-described multilayered piezoelectric element; and a discharge port in communication with the liquid chamber. The liquid discharged by a liquid discharge head according to an embodiment of the present invention is not particularly limited as long as the liquid is a fluid. Specifically, the liquid discharge head can discharge aqueous liquids and nonaqueous liquids, such as water, ink, and fuel.

Figure 3A:
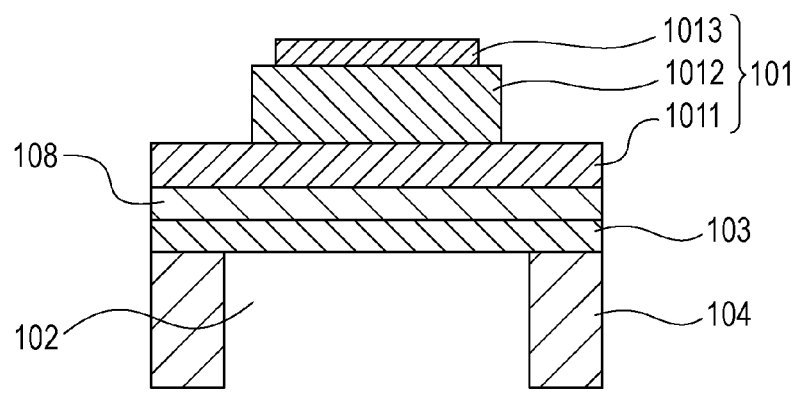
FIGS. 3A and 3B each include a schematic view illustrating the configuration of a liquid discharge head according to an embodiment of the present invention.
Figure 3B:
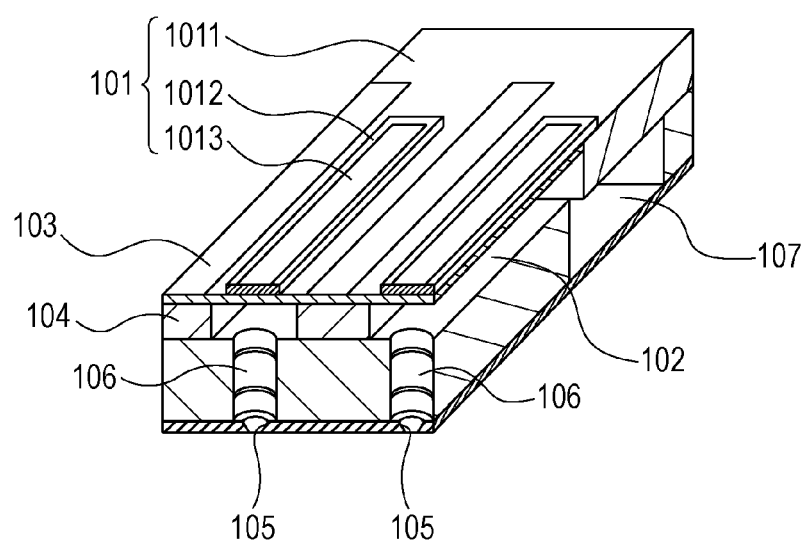

FIGS. 3A and 3B each include a schematic view illustrating the configuration of a liquid discharge head according to an embodiment of the present invention. As illustrated in FIGS. 3A and 3B, the liquid discharge head of the embodiment includes a piezoelectric element 101 according to an embodiment of the present invention. The piezoelectric element 101 at least includes a first electrode 1011, a piezoelectric material 1012, and a second electrode 1013. As illustrated in FIG. 3B, when necessary, the piezoelectric material 1012 is patterned.

FIG. 3B is a schematic view of the liquid discharge head. The liquid discharge head includes a discharge port 105, an individual liquid chamber 102, a communicating channel that connects the individual liquid chamber 102 with the discharge port 105, a liquid chamber partition 104, and a common liquid chamber 107, a vibrating plate 103, and the piezoelectric element 101. In FIG. 3B, the components of the piezoelectric element 101 each have a rectangular shape. Alternatively, the shapes of the components of the piezoelectric element 101 may be other than a rectangle, such as an ellipse, a circle, or a parallelogram. In general, the piezoelectric material 1012 is formed so as to conform to the shape of the individual liquid chamber 102.

The configuration around the piezoelectric element 101 in the liquid discharge head of the embodiment will be described in detail with reference to FIG. 3A. FIG. 3A is a cross-section taken in the width direction of the piezoelectric element in FIG. 3B. Although the cross-section of the piezoelectric element 101 is illustrated as rectangles in FIG. 3A, it may have a trapezoidal shape or an inverted trapezoidal shape.

In FIG. 3A, the first electrode 1011 is used as a lower electrode and the second electrode 1013 is used as an upper electrode. However, the configuration of the first electrode 1011 and the second electrode 1013 is not limited to this configuration. For example, the first electrode 1011 may be used as a lower electrode or an upper electrode. Similarly, the second electrode 1013 may be used as an upper electrode or a lower electrode. A buffer layer 108 may be disposed between the vibrating plate 103 and the lower electrode. Such differences in naming are derived from the device production method and advantages of the present invention are provided in either case.

In the liquid discharge head, the vibrating plate 103 moves up and down in response to expansion and contraction of the piezoelectric material 1012 and applies a pressure to the liquid in the individual liquid chamber 102. As a result, the liquid is discharged through the discharge port 105. The liquid discharge head of the embodiment can be used for printer applications and production of electronic devices. The vibrating plate 103 can have a thickness of 1.0 μm or more and 15 μm or less, preferably 1.5 μm or more and 8 μm or less. The material of the vibrating plate is not limited and can be Si. Si of the vibrating plate may be doped with boron or phosphorus. The buffer layer and electrode on the vibrating plate may serve as parts of the vibrating plate. The buffer layer 108 can have a thickness of 5 nm or more and 300 nm or less, preferably 10 nm or more and 200 nm or less. The discharge port 105 can have a circular equivalent diameter of 5 μm or more and 40 μm or less. The discharge port 105 can have a circular shape, a star shape, a rectangular shape, or a triangular shape.

Liquid Discharge Apparatus

Hereinafter, a liquid discharge apparatus according to an embodiment of the present invention will be described. A liquid discharge apparatus according to an embodiment of the present invention includes a transfer medium mounting unit and the above-described liquid discharge head.

Figure 4:
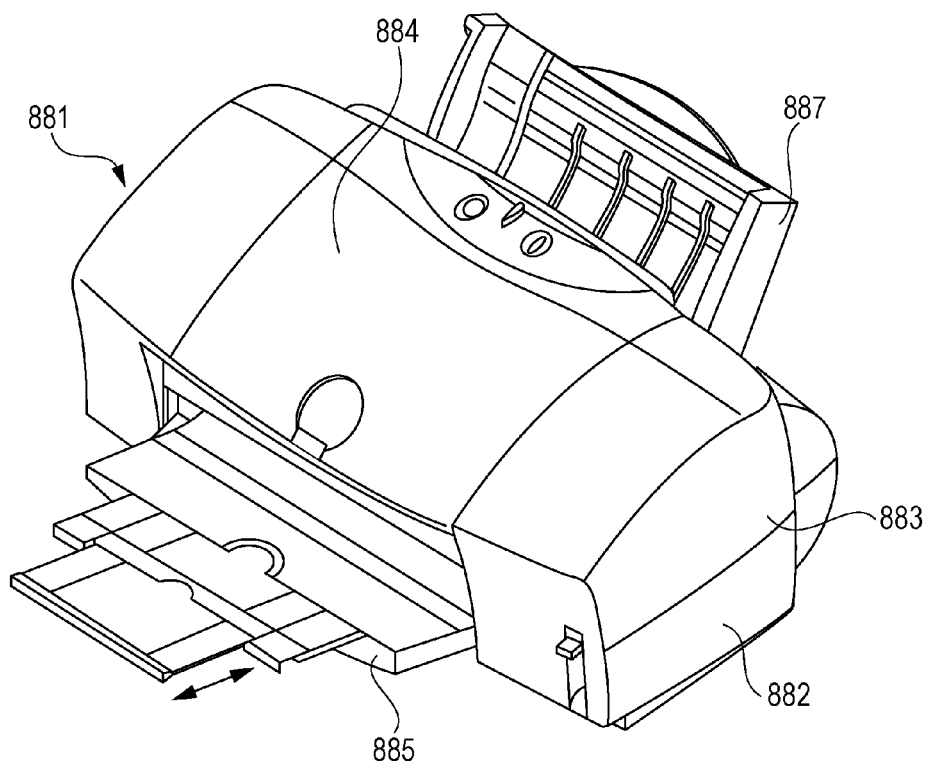
FIG. 4 is a schematic view illustrating a liquid discharge apparatus according to an embodiment of the present invention.
Figure 5:
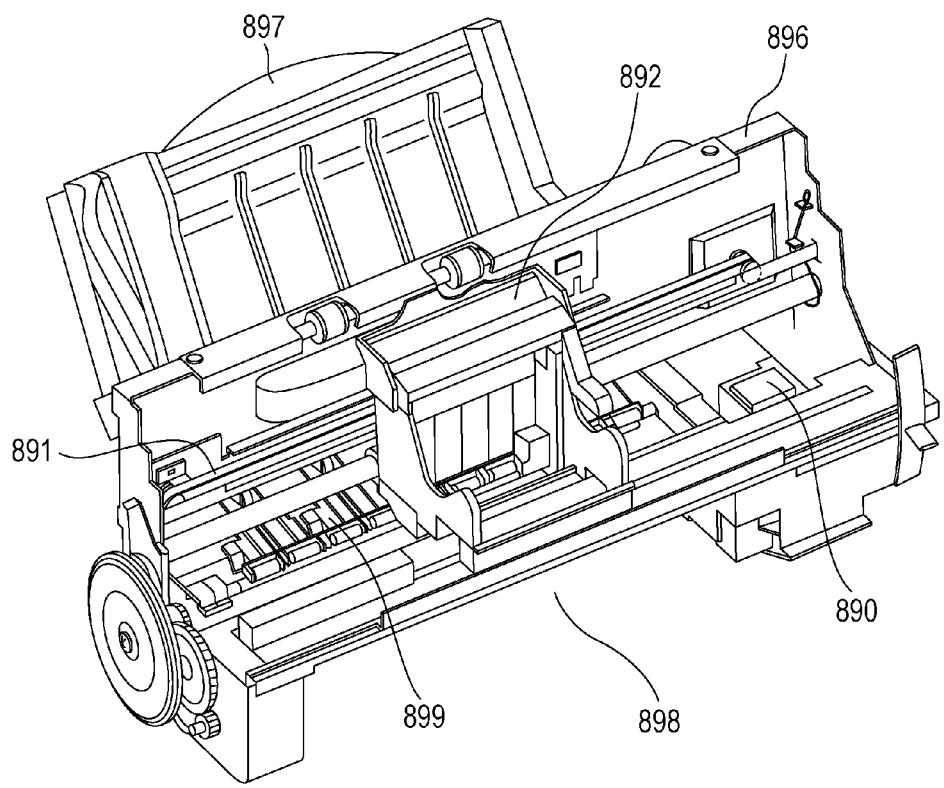
FIG. 5 is a schematic view illustrating a liquid discharge apparatus according to an embodiment of the present invention.

A liquid discharge apparatus according to an embodiment of the present invention is an inkjet recording apparatus illustrated in FIGS. 4 and 5. FIG. 5 illustrates a state in which exterior members 882 to 885 and 887 have been removed from a liquid discharge apparatus (inkjet recording apparatus) 881 in FIG. 4. The inkjet recording apparatus 881 includes an automatic feeding unit 897 that automatically feeds a recording paper sheet serving as a transfer medium into an apparatus body 896; a transport unit 899 (serving as a transfer medium mounting unit) that guides a recording paper sheet fed from the automatic feeding unit 897, to a predetermined recording position and from the recording position to an exit port 898; a recording unit 891 that performs recording on a recording paper sheet transported to the recording position; and a recovery unit 890 that performs a recovery process for the recording unit 891. The recording unit 891 is equipped with a carriage 892 that includes a liquid discharge head according to an embodiment of the present invention and that is reciprocated on a rail.

In such an inkjet recording apparatus, the carriage 892 is moved on the rail in accordance with electric signals sent from a computer; and application of drive voltage to the electrodes sandwiching the piezoelectric material causes a displacement of the piezoelectric material. Referring to FIG. 3B, this displacement of the piezoelectric material results in pressing of the individual liquid chamber 102 through the vibrating plate 103, so that ink is discharged through the discharge port 105 to perform printing. In a liquid discharge apparatus according to an embodiment of the present invention, liquid can be discharged uniformly at a high velocity and reduction of the size of the apparatus can be achieved.

The printer has been described as a liquid discharge apparatus according to an embodiment of the present invention. Alternatively, a liquid discharge apparatus according to an embodiment of the present invention can be used as an inkjet recording apparatus such as a facsimile machine, a multifunction apparatus, or a copier; or an industrial liquid discharge apparatus. The user can select a desired transfer medium in accordance with the application. A configuration may be employed in which a liquid discharge head is moved relative to a transfer medium mounted on a stage serving as a mounting unit.

Ultrasonic Motor

Figure 6A:
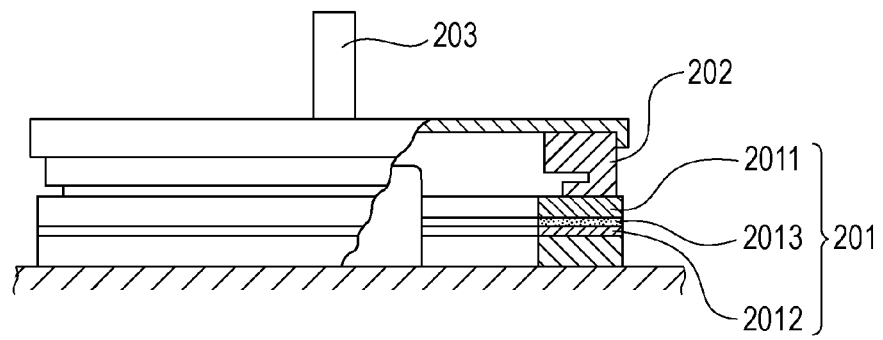
FIGS. 6A and 6B each include a schematic view illustrating the configuration of an ultrasonic motor according to an embodiment of the present invention.
Figure 6B:
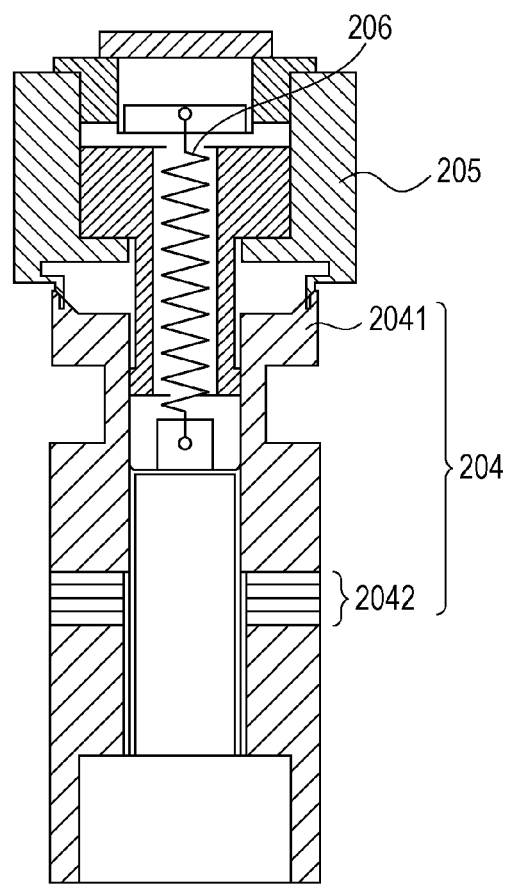

An ultrasonic motor according to an embodiment of the present invention at least includes a vibrating member including the above-described piezoelectric element or the above-described multilayered piezoelectric element; and a moving member in contact with the vibrating member. FIGS. 6A and 6B each include a schematic view illustrating the configuration of an ultrasonic motor according to an embodiment of the present invention. FIG. 6A illustrates an ultrasonic motor including a single-plate-configuration piezoelectric element according to an embodiment of the present invention. This ultrasonic motor includes a vibrator 201; a rotor 202 that is pressed by a press spring (not shown) so as to be in contact with a sliding surface of the vibrator 201; and an output shaft 203 that is provided so as to be integrated with the rotor 202. The vibrator 201 includes a metal elastic ring 2011, a piezoelectric element 2012 according to an embodiment of the present invention, and an organic adhesive 2013 (such as an epoxy adhesive or a cyanoacrylate adhesive) that bonds the piezoelectric element 2012 to the elastic ring 2011. The piezoelectric element 2012 of the embodiment includes a piezoelectric material sandwiched between a first electrode and a second electrode (not shown). When two-phase alternating voltages that are out of phase by an odd multiple of $\pi/4$ are applied to the piezoelectric element of the embodiment, flexural traveling waves are generated in the vibrator 201 and points on the sliding surface of the vibrator 201 are moved in an elliptic motion. When the rotor 202 is pressed onto the sliding surface of the vibrator 201, the rotor 202 is subjected to a frictional force from the vibrator 201 and rotated in a direction opposite to the direction of flexural traveling waves. A driven object (not shown) is connected to the output shaft 203 and is driven by the rotational force from the rotor 202. When a voltage is applied to a piezoelectric material, a transverse piezoelectric effect is caused so that the piezoelectric material is expanded or contracted; when an elastic member such as a metal member is joined to this piezoelectric material, the elastic member is bent by expansion and contraction of the piezoelectric material. The ultrasonic motor described above utilizes this principle. Another embodiment will be described: FIG. 6B illustrates an ultrasonic motor including a piezoelectric element having a multilayered structure. A vibrator 204 includes a multilayered piezoelectric element 2042 sandwiched between cylindrical metal elastic members 2041. The multilayered piezoelectric element 2042 includes plural stacked piezoelectric materials (not shown), first and second electrodes disposed on the external surfaces of the stacked materials, and internal electrodes within the stacked materials. The metal elastic members 2041 are bonded together with bolts so as to sandwich and hold the piezoelectric element 2042 therebetween. Thus, the metal elastic members 2041 and the piezoelectric element 2042 constitute the vibrator 204. By applying alternating voltages that are out of phase to the piezoelectric element 2042, two vibrations orthogonal to each other are generated in the vibrator 204. These two vibrations are combined to form a circular vibration that drives a tip of the vibrator 204. An upper portion of the vibrator 204 has an annular groove. The annular groove increases the displacement of vibration for driving. A rotor 205 is pressed by a press spring 206 onto the vibrator 204 to thereby gain a frictional force for driving. The rotor 205 is rotatably supported with a bearing.

Optical Apparatus

Hereinafter, an optical apparatus according to an embodiment of the present invention will be described. An optical apparatus according to an embodiment of the present invention includes a drive unit including the above-described ultrasonic motor.

Figure 7A:
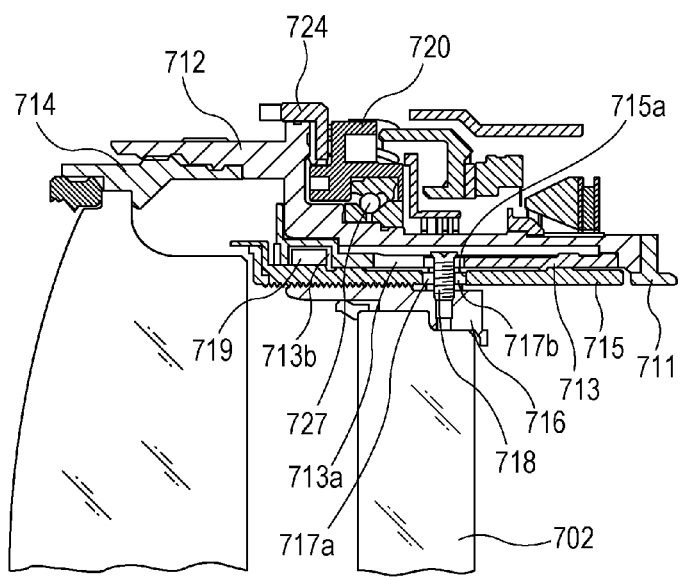
FIGS. 7A and 7B each include a schematic view illustrating an optical apparatus according to an embodiment of the present invention.
Figure 7B:
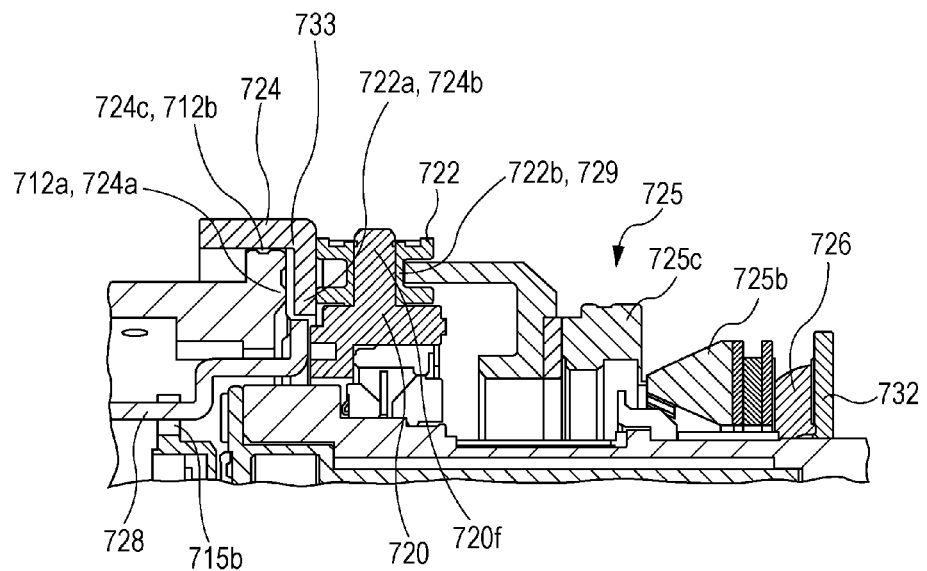
Figure 8:
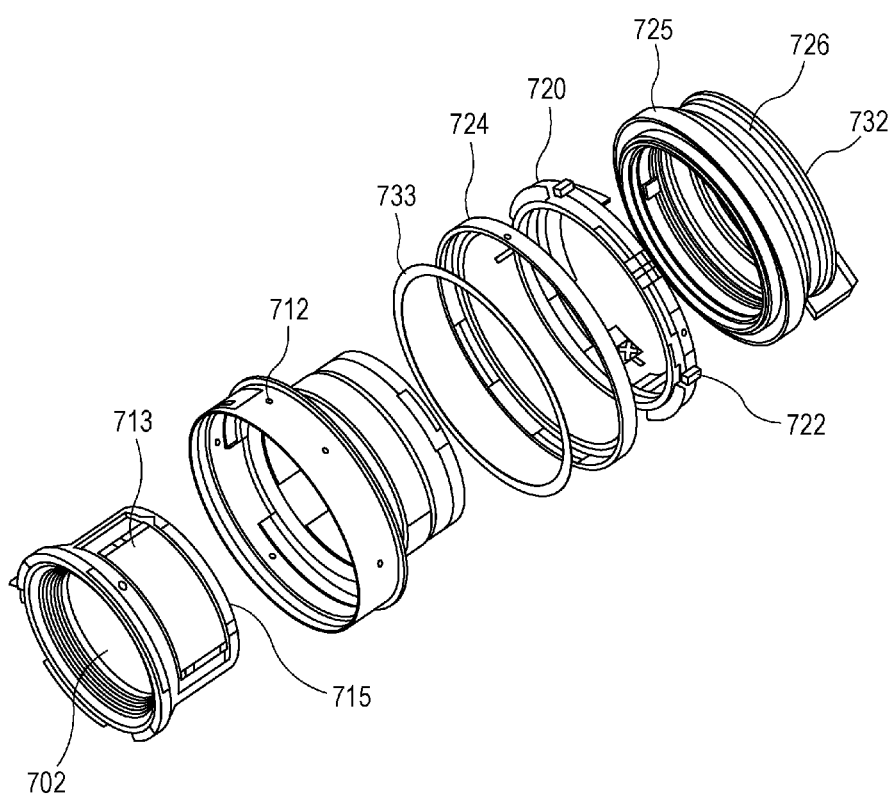
FIG. 8 is a schematic view illustrating an optical apparatus according to an embodiment of the present invention.

FIGS. 7A and 7B are sectional views of main portions of an interchangeable lens barrel for a single lens reflex camera, which is an image pickup apparatus according to an embodiment of the present invention. FIG. 8 is an exploded perspective view of an interchangeable lens barrel for a single lens reflex camera, which is an image pickup apparatus according to an embodiment of the present invention. A fixed barrel 712, a linear guide barrel 713, and a front lens group barrel 714 are fixed on a removal mount 711 for a camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a shaft screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint member 729. Six driven rollers 722 are disposed at regular intervals on the periphery of the rotation transmitting ring 720. Each of the driven rollers 722 satisfies the structural relationship described above.

A low-friction sheet (washer member) 733 is disposed in the inner periphery of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the inner diameter 724c of the manual focus ring 724. The inner diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring because the wave washer 726 presses the ultrasonic motor 725 forward to the front of the lens. Likewise, because the wave washer 726 presses the ultrasonic motor 725 forward to the front of the lens, the small-diameter portion 722b of the driven roller 722 is appropriately pressed against the joint member 729. The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and furthermore presses the manual focus ring 724 against the mount side end face 712a of the fixed barrel 712. In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint member 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input unit (not shown) provides the manual focus ring 724 with rotational force about the optical axis, since the mount side end face 724b of the manual focus ring 724 is pressed against the large-diameter portion 722a of the driven roller 722, the driven roller 722 is rotated about the shaft 720f because of friction force. The rotation of the large-diameter portion 722a of the driven roller 722 about the shaft 720f causes the rotation of the rotation transmitting ring 720 about the optical axis. However, the ultrasonic motor 725 is not rotated because of the friction force between a rotor 725c and a stator 725b (manual focusing).

The rotation transmitting ring 720 is provided with two focus keys 728 facing each other. These focus keys 728 fit into notches 715b at the tip of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear group lens barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single lens reflex camera, the optical apparatus may also be applied to optical apparatuses that include an ultrasonic motor in a drive unit, for example, cameras, such as compact cameras, electronic still cameras, and personal digital assistants including a camera.

Vibratory Apparatus and Dust Removing Apparatus

Vibratory apparatuses for conveying or removing particles, powders, and droplets are widely used in electronic apparatuses.

Hereinafter, a dust removing apparatus including a vibratory apparatus according to an embodiment of the present invention including a piezoelectric element according to an embodiment of the present invention will be described.

A dust removing apparatus according to an embodiment of the present invention includes a vibrating member including the above-described piezoelectric element or the above-described multilayered piezoelectric element.

Figure 9A:
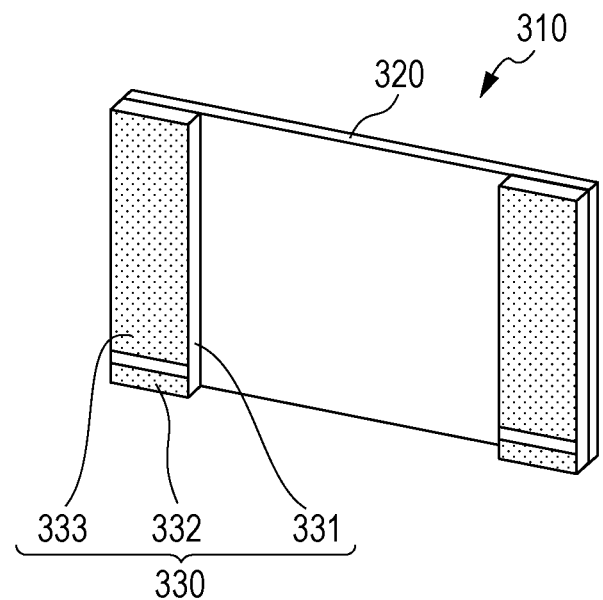
FIGS. 9A and 9B each include a schematic view illustrating a dust removing apparatus including a vibratory apparatus according to an embodiment of the present invention.
Figure 9B:
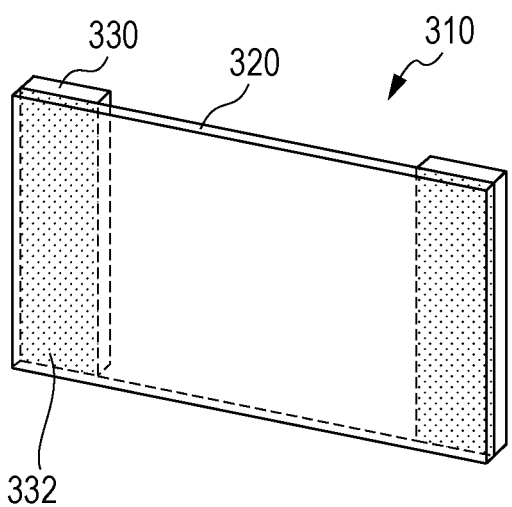

FIGS. 9A and 9B are schematic views of a dust removing apparatus according to an embodiment of the present invention. A dust removing apparatus 310 includes a plate-shaped piezoelectric element 330 and a vibrating plate 320. The piezoelectric element 330 may be a multilayered piezoelectric element according to an embodiment of the present invention. The vibrating plate 320 may be made of any material. When the dust removing apparatus 310 is used in optical devices, the vibrating plate 320 may be made of a light transmitting material or a light reflective material.

Figure 10A:
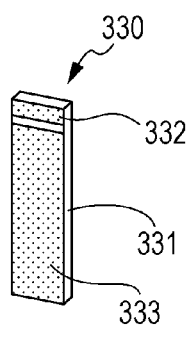
FIGS. 10A to 10C are schematic views illustrating the configuration of a piezoelectric element in a dust removing apparatus according to an embodiment of the present invention.
Figure 10B:
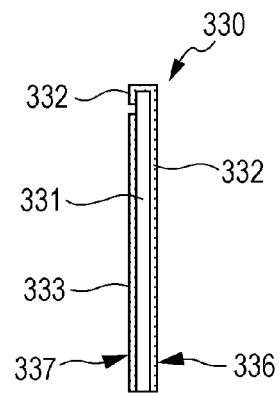
Figure 10C:
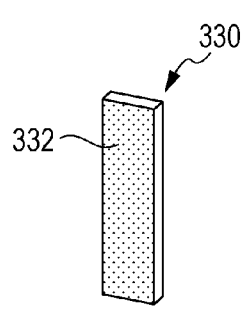

FIGS. 10A to 10C are schematic views illustrating the configuration of the piezoelectric element 330 in FIGS. 9A and 9B. FIGS. 10A and 10C illustrate the front and back sides of the piezoelectric element 330. FIG. 10B is a side view of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are disposed on opposite sides of the piezoelectric material 331. As in FIGS. 9A and 9B, the piezoelectric element 330 may be a multilayered piezoelectric element according to an embodiment of the present invention. In this case, the piezoelectric material 331 includes piezoelectric material layers and internal electrodes alternately stacked on top of one another. The internal electrodes are alternately short-circuited to the first electrode 332 and the second electrode 333, thereby allowing the piezoelectric material layers to alternately have a driving waveform of a different phase. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the vibrating plate 320. Driving of the piezoelectric element 330 produces a stress between the piezoelectric element 330 and the vibrating plate 320, causing out-of-plane vibrations on the vibrating plate 320. The dust removing apparatus 310 of the embodiment removes foreign matter, such as dust, on the vibrating plate 320 by the action of out-of-plane vibrations. The term "out-of-plane vibrations", as used herein, refers to elastic vibrations that cause displacements of a vibrating plate in the optical axis direction, that is, the vibrating plate thickness direction.

FIGS. 11A and 11B are schematic views illustrating the vibration principle of a dust removing apparatus 310 according to an embodiment of the present invention. In FIG. 11A, in-phase alternating electric fields are applied to a left-and-right pair of the piezoelectric elements 330 to cause out-of-plane vibrations of the vibrating plate 320. The direction of polarization of the piezoelectric material constituting the left-and-right pair of the piezoelectric elements 330 is the same as the thickness direction of the piezoelectric elements 330. The dust removing apparatus 310 is driven in a seventh vibration mode. In FIG. 11B, anti-phase alternating voltages (out of phase by 180°) are applied to a left-and-right pair of the piezoelectric elements 330 to cause out-of-plane vibrations of the vibrating plate 320. The dust removing apparatus 310 is driven in a sixth vibration mode. The dust removing apparatus 310 of the embodiment can employ at least two vibration modes to effectively remove dust on the surface of the vibrating plate.

Image Pickup Apparatus

Figure 12:
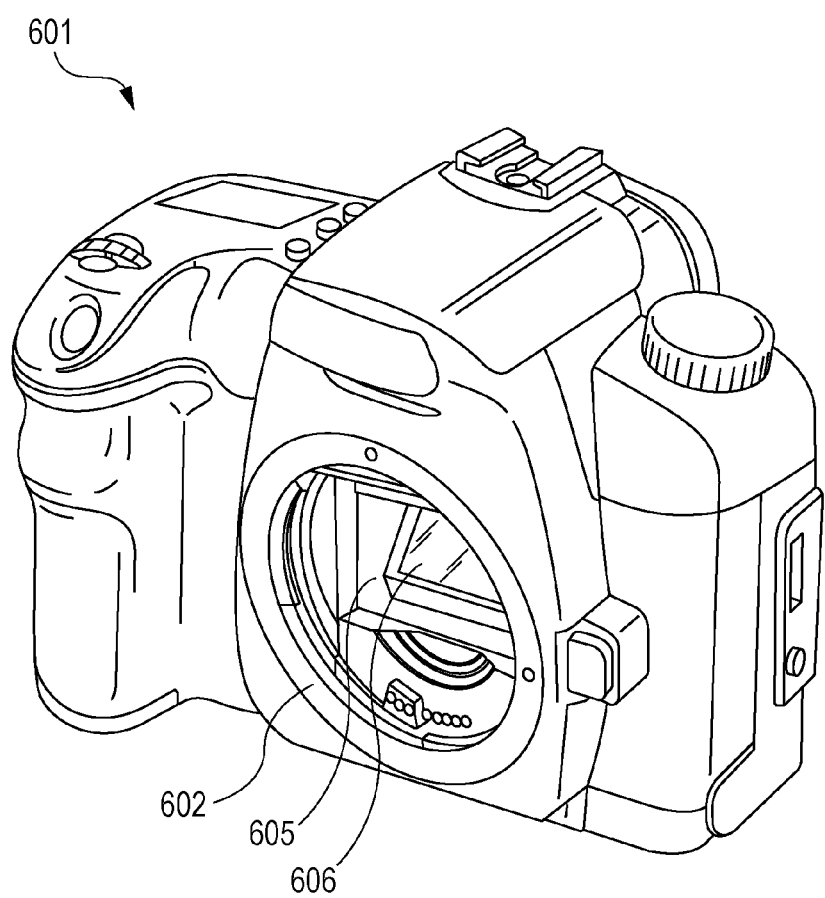
FIG. 12 is a schematic view illustrating an image pickup apparatus according to an embodiment of the present invention.
Figure 13:
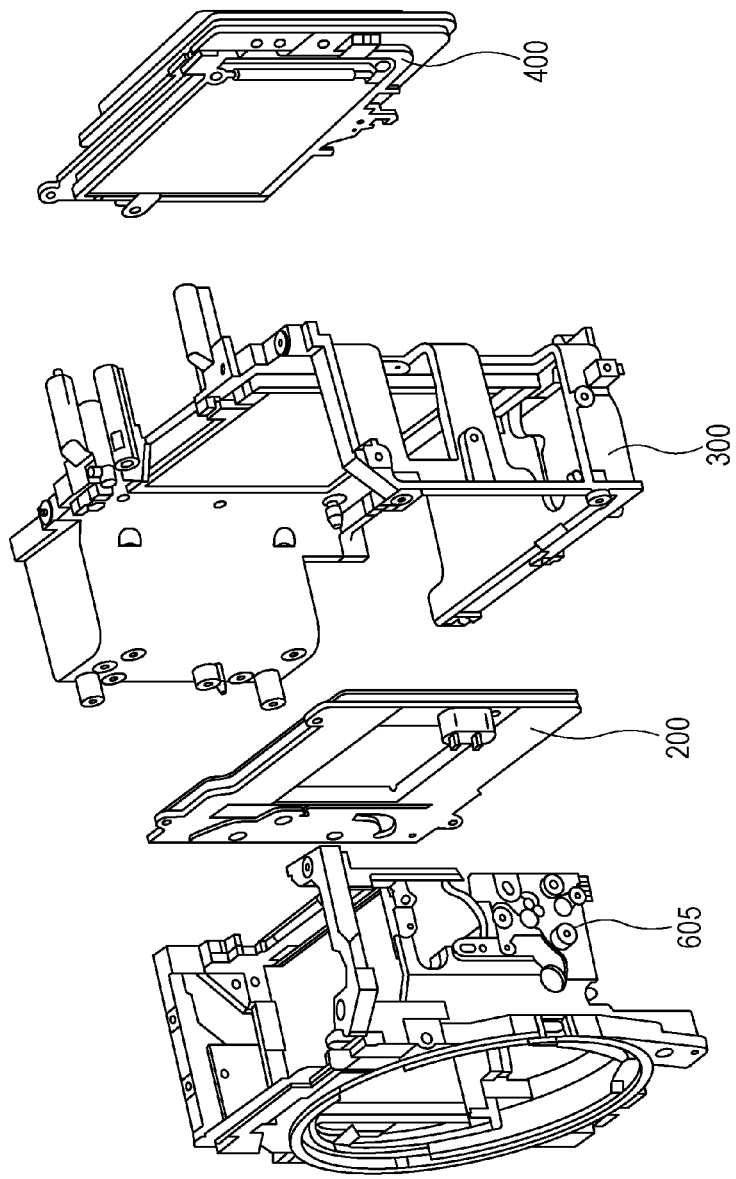
FIG. 13 is a schematic view illustrating an image pickup apparatus according to an embodiment of the present invention.

Hereinafter, an image pickup apparatus according to an embodiment of the present invention will be described. An image pickup apparatus according to an embodiment of the present invention includes the dust removing apparatus described above and an image pickup element unit, wherein the dust removing apparatus includes the vibrating plate disposed on a light-receiving surface side of the image pickup element unit. FIGS. 12 and 13 illustrate a digital single lens reflex camera, which is an image pickup apparatus according to an embodiment of the present invention.

FIG. 12 is a front perspective view of a main body 601 of the camera viewed from the object side, where a lens unit has been removed. FIG. 13 is an exploded perspective view of the inside of the camera, illustrating surrounding structures of a dust removing apparatus according to an embodiment of the present invention and an image pickup unit 400.

The main body 601 of the camera includes a mirror box 605 to which an image light beam passing through a lens is directed. The mirror box 605 includes a main mirror (quick return mirror) 606. The main mirror 606 can make an angle of 45° with the imaging optical axis to direct an image light beam to a penta dach mirror (not shown) or may avoid the image light beam in order to direct the image light beam to an image pickup element (not shown).

The mirror box 605 and a shutter unit 200 are disposed in front of a main body chassis 300 serving as the skeleton of the main body of the camera in this order from the object side. The image pickup unit 400 is disposed on the photographer side of the main body chassis 300. The image pickup unit 400 is installed such that an image pickup surface of the image pickup element is disposed at a predetermined distance from and parallel to the surface of a mount 602 to which a lens unit is to be attached.

Although the digital single lens reflex camera has been described as an image pickup apparatus according to an embodiment of the present invention, the image pickup apparatus may be an interchangeable-lens camera, such as a mirrorless digital single lens camera without the mirror box 605. Among various image pickup apparatuses and electrical and electronic apparatuses that include image pickup apparatuses, such as interchangeable-lens video cameras, copiers, facsimile machines, and scanners, in particular, an image pickup apparatus according to an embodiment of the present invention can also be applied to apparatuses that require the removal of dust deposited on a surface of an optical part.

Electronic Apparatus

Hereinafter, an electronic apparatus according to an embodiment of the present invention will be described. The electronic apparatus includes a piezoelectric acoustic component that includes the above-described piezoelectric element or the above-described multilayered piezoelectric element. The piezoelectric acoustic component may be a loudspeaker, a buzzer, a microphone, or a surface acoustic wave (SAW) device.

Figure 14:
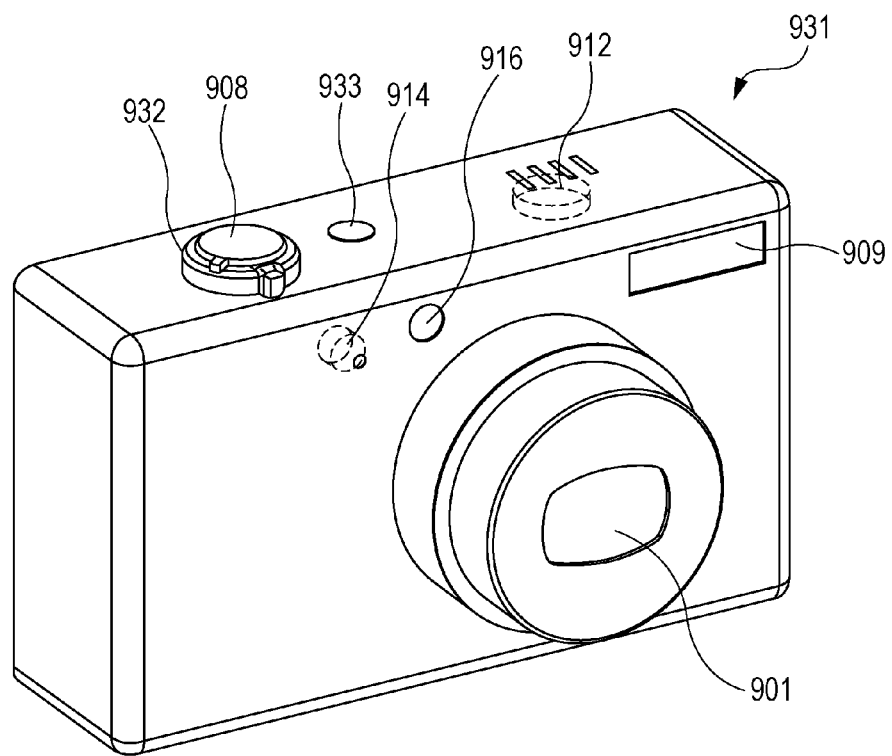
FIG. 14 is a schematic view illustrating an electronic apparatus according to an embodiment of the present invention.

FIG. 14 is a perspective view of a main body 931 of a digital camera, which is an electronic apparatus according to an embodiment of the present invention, viewed from the front of the digital camera. An optical device 901, a microphone 914, an electronic flash unit 909, and a fill light unit 916 are disposed on the front surface of the main body 931. The microphone 914 is disposed within the main body and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

A piezoelectric acoustic component according to an embodiment of the present invention may be used in at least one of the microphone 914, the loudspeaker 912, and a surface acoustic wave device.

Although the digital camera has been described as an electronic apparatus according to an embodiment of the present invention, the electronic apparatus may also be applied to various electronic apparatuses that include piezoelectric acoustic components, such as audio-reproducing devices, audio-recording devices, mobile phones, and information terminals.

As described above, a piezoelectric element and a multi-layered piezoelectric element according to an embodiment of the present invention can be suitably used for liquid discharge heads, liquid discharge apparatuses, ultrasonic motors, optical apparatuses, vibratory apparatuses, dust removing apparatuses, image pickup apparatuses, and electronic apparatuses. A liquid discharge head manufactured by using a piezoelectric element or a multilayered piezoelectric element according to an embodiment of the present invention can have a nozzle density and a discharge velocity higher than or equal to those of liquid discharge heads manufactured by using a lead-containing piezoelectric element.

A liquid discharge apparatus manufactured by using a liquid discharge head according to an embodiment of the present invention can have a discharge velocity and discharge accuracy higher than or equal to those of liquid discharge apparatuses manufactured by using a lead-containing piezoelectric element.

An ultrasonic motor manufactured by using a piezoelectric element or a multilayered piezoelectric element according to an embodiment of the present invention can have driving force and durability higher than or equal to those of ultrasonic motors manufactured by using a lead-containing piezoelectric element.

An optical apparatus manufactured by using an ultrasonic motor according to an embodiment of the present invention can have durability and operation accuracy higher than or equal to those of optical apparatuses manufactured by using a lead-containing piezoelectric element.

A vibratory apparatus manufactured by using a piezoelectric element or a multilayered piezoelectric element according to an embodiment of the present invention can have vibratory capacity and durability higher than or equal to those of vibratory apparatuses manufactured by using a lead-containing piezoelectric element.

A dust removing apparatus manufactured by using a vibratory apparatus according to an embodiment of the present invention can have dust removal efficiency and durability higher than or equal to those of dust removing apparatuses manufactured by using a lead-containing piezoelectric element.

An image pickup apparatus manufactured by using a dust removing apparatus according to an embodiment of the present invention can have a dust removal function higher than or equal to those of image pickup apparatuses manufactured by using a lead-containing piezoelectric element.

A piezoelectric acoustic component that includes a piezoelectric element or a multilayered piezoelectric element according to an embodiment of the present invention can be used to provide an electronic apparatus that has sound production ability higher than or equal to those of electronic apparatuses manufactured by using a lead-containing piezoelectric element.

A piezoelectric material according to an embodiment of the present invention may be used in devices such as ultrasonic transducers, piezoelectric actuators, piezoelectric sensors, and ferroelectric memories, as well as liquid discharge heads and motors.

EXAMPLES

Hereinafter, the present invention will be described further in detail with reference to examples. However, the present invention is not limited to these examples.

Piezoelectric ceramics according to embodiments of the present invention were produced.

Examples 1 to 31 and Comparative examples 1 to 15

A barium titanate powder ($BaTiO_3$, Ba/Ti=0.9985), a calcium titanate powder ($CaTiO_3$, Ca/Ti=0.9978), a calcium zirconate powder ($CaZrO_3$, Ca/Zr=0.999), and a calcium stannate powder (Ca/Sn=1.0137) that each had an average particle size of 100 nm were weighed such that molar ratios in Table 1 below were satisfied. The molar ratio a of the total number of moles of Ba and Ca to the total number of moles of Ti, Zr, and Sn was adjusted so as to be values in Table 1 with barium oxalate or the like. To the resultant powder mixtures, lithium carbonate, bismuth oxide, and tetramanganese trioxide were weighed and added such that the weight contents of Li, Bi, and Mn on a metal basis satisfy the values in Table 1. The weighed powders were mixed by dry mixing with a ball mill for 24 hours. In order to granulate each resultant powder mixture, 3 parts by weight of a PVA binder with respect to the powder mixture was made to adhere to the surfaces of particles of the powder mixture with a spray dryer apparatus.

The granulated powder was charged into a mold and pressed at 200 MPa with a press machine to form a compact having a disc shape. Such a compact may be further pressed with a cold isostatic press.

The compact was placed in an electric furnace and held at a maximum temperature of 1320° C. to 1360° C. for 5 hours, so that the compact was sintered for 24 hours in total in the ambient atmosphere. In this way, ceramics formed of piezoelectric materials according to embodiments of the present invention were obtained.

The crystal grains of the obtained ceramics were evaluated in terms of average circular equivalent diameter and relative density. As a result, the average circular equivalent diameter was 10 to 50 μm and samples other than Comparative example 7 had a relative density of 95% or more. The crystal grains were mainly observed with a polarizing microscope. When the grain sizes of small crystal grains were determined, a scanning electron microscope (SEM) was used. From the observation results, average circular equivalent diameters were calculated. The relative density was evaluated with a theoretical density calculated from a lattice constant determined by X-ray diffractometry and a weighing composition and with a density actually measured by Archimedes' method.

The valence of Mn in the samples of Examples 10 and 12 was evaluated. The temperature dependency of magnetic susceptibility of the samples at 2 to 60 K was measured with SQUID. From the temperature dependency of magnetic susceptibility, the average valences of Mn of the samples of Examples 10 and 12 were found to be +3.8 and +3.9, respectively. As the molar ratio of Bi to Mn increased, the valence of Mn tended to decrease. Similarly, the magnetic susceptibility of Mn in Comparative example 2 in which the Bi content was low and the valence of Mn was found to be about +4.

The obtained ceramics were polished so as to have a thickness of 0.5 mm and subjected to crystal structure analysis by X-ray diffractometry. As a result, except for Comparative example 1, only peaks corresponding to perovskite structures were observed.

In each of the disc-shaped ceramics, gold electrodes having a thickness of 400 nm were formed by DC sputtering method on the front and back surfaces of the ceramic. A titanium layer having a thickness of 30 nm was formed as an adhesion layer between the electrode and the ceramic. This ceramic having electrodes was cut to provide a strip-shaped piezoelectric element having dimensions of 10 mm×2.5 mm×0.5 mm. This piezoelectric element was placed on a hot plate set to have a surface temperature of 60° C. to 100° C. An electric field of 1 kV/mm was applied to the piezoelectric element on the hot plate for 30 minutes to thereby perform a poling process.

Static characteristics of piezoelectric elements including piezoelectric materials according to embodiments of the present invention and piezoelectric elements including piezoelectric materials of Comparative examples were evaluated. Specifically, piezoelectric elements having been subjected to the poling process were evaluated in terms of piezoelectric constant $d_{31}$ and mechanical quality factor Qm by a resonance-antiresonance method. $T_{ot}$, $T_{to}$, and $T_C$ of each sample were calculated from the electrostatic capacitance of the sample measured with a commercially available impedance analyzer while the temperature of the sample was changed. At the same time, the temperature dependency of the dielectric loss tangent was measured with the impedance analyzer. The temperature of the sample was decreased from room temperature and subsequently increased to $T_C$ or higher. The temperature $T_{to}$ is a temperature at which transition of the crystal system from a tetragonal crystal to an orthorhombic crystal occurs. The dielectric constant of the sample is measured while the sample is cooled; and a temperature at which a value obtained by differentiating the dielectric constant with respect to the sample temperature becomes maximum is defined as the temperature $T_{to}$. The temperature $T_{ot}$ is a temperature at which transition of the crystal system from an orthorhombic crystal to a tetragonal crystal occurs. The dielectric constant of the sample is measured while the sample is heated; and a temperature at which a value obtained by differentiating the dielectric constant with respect to the sample temperature becomes maximum is defined as the temperature $T_{ot}$.

TABLE 1

| | BaTiO$_3$ (Mol %) | CaTiO$_3$ (Mol %) | CaZrO$_3$ (Mol %) | CaSnO$_3$ (Mol %) | a (—) | Li (wt %) | Bi (wt %) | Mn (wt %) | Sintering temperature (° C.) | Density (g/cm$^3$) |
|---|---|---|---|---|---|---|---|---|---|---|
| Comparative example 1 | 68 | 27 | 5 | 0 | 0.999 | 0.0056 | 0.17 | 0.24 | 1360 | 5.15 |
| Example 1 | 70 | 23.1 | 6.9 | 0 | 0.9994 | 0.0056 | 0.17 | 0.24 | 1360 | 5.27 |
| Example 2 | 70 | 25 | 5 | 0 | 0.9994 | 0.0056 | 0.17 | 0.24 | 1360 | 5.26 |
| Example 3 | 70 | 25.9 | 4.1 | 0 | 0.9994 | 0.0056 | 0.17 | 0.24 | 1360 | 5.21 |
| Example 4 | 74 | 19.8 | 6.2 | 0 | 0.9994 | 0.0056 | 0.17 | 0.24 | 1360 | 5.31 |
| Example 5 | 74 | 21.5 | 4.5 | 0 | 0.9994 | 0.0056 | 0.17 | 0.24 | 1360 | 5.31 |
| Example 6 | 78 | 15.5 | 6.5 | 0 | 0.9994 | 0.0056 | 0.17 | 0.24 | 1360 | 5.40 |
| Example 7 | 80 | 14.5 | 5.5 | 0 | 0.9994 | 0.0056 | 0.17 | 0.24 | 1360 | 5.58 |
| Example 8 | 81.3 | 12.7 | 6 | 0 | 0.9994 | 0.0056 | 0.17 | 0.24 | 1360 | 5.43 |
| Comparative example 2 | 83 | 10.5 | 6.5 | 0 | 1.0031 | 0.00084 | 0.025 | 0.18 | 1340 | 5.62 |
| Example 9 | 83 | 10.5 | 5.5 | 1 | 0.9971 | 0.0056 | 0.17 | 0.18 | 1340 | 5.67 |
| Example 10 | 83 | 10.5 | 6.5 | 0 | 0.9971 | 0.0056 | 0.17 | 0.18 | 1340 | 5.65 |
| Comparative example 3 | 83 | 10.5 | 6.5 | 0 | 1.0031 | 0.00084 | 0.025 | 0.36 | 1340 | 5.67 |
| Example 11 | 83 | 10.5 | 5.5 | 1 | 1.0042 | 0.0056 | 0.17 | 0.36 | 1340 | 5.70 |
| Example 12 | 83 | 10.5 | 6.5 | 0 | 1.0042 | 0.0056 | 0.17 | 0.36 | 1340 | 5.67 |
| Comparative example 4 | 84 | 11 | 5 | 0 | 1.0031 | 0.00084 | 0.025 | 0.18 | 1340 | 5.61 |
| Example 13 | 84 | 11 | 4 | 1 | 0.9971 | 0.0056 | 0.17 | 0.18 | 1340 | 5.59 |
| Example 14 | 84 | 11 | 5 | 0 | 0.9971 | 0.0056 | 0.17 | 0.18 | 1340 | 5.58 |
| Comparative example 5 | 84 | 11 | 5 | 0 | 1.0100 | 0.00084 | 0.025 | 0.36 | 1340 | 5.61 |
| Example 15 | 84 | 11 | 4 | 1 | 1.0042 | 0.0056 | 0.17 | 0.36 | 1340 | 5.69 |
| Example 16 | 84 | 11 | 5 | 0 | 1.0042 | 0.0056 | 0.17 | 0.36 | 1340 | 5.67 |
| Example 17 | 84.5 | 11.4 | 4.1 | 0 | 0.9994 | 0.0056 | 0.17 | 0.24 | 1340 | 5.42 |
| Example 18 | 84.5 | 8.6 | 6.9 | 0 | 0.9994 | 0.0056 | 0.17 | 0.24 | 1340 | 5.45 |
| Example 19 | 86 | 8 | 6 | 0 | 0.9955 | 0.0056 | 0.17 | 0.14 | 1340 | 5.37 |
| Comparative example 6 | 87 | 7.1 | 5.9 | 0 | 1.0055 | 0.00084 | 0.025 | 0.24 | 1320 | 5.53 |
| Comparative example 7 | 87 | 7.1 | 5.9 | 0 | 1.021 | 0.0056 | 0.17 | 0.24 | 1320 | 5.21 |
| Comparative example 8 | 87 | 7.1 | 5.9 | 0 | 0.985 | 0.0056 | 0.17 | 0.24 | 1320 | 5.47 |
| Example 20 | 87 | 7.1 | 5.9 | 0 | 0.9994 | 0.0056 | 0.17 | 0.24 | 1320 | 5.72 |
| Example 21 | 87 | 7.1 | 5.9 | 0 | 0.9994 | 0.0045 | 0.17 | 0.24 | 1320 | 5.70 |

TABLE 1-continued

| | BaTiO$_3$ (Mol %) | CaTiO$_3$ (Mol %) | CaZrO$_3$ (Mol %) | CaSnO$_3$ (Mol %) | a (—) | Li (wt %) | Bi (wt %) | Mn (wt %) | Sintering temperature (° C.) | Density (g/cm$^3$) |
|---|---|---|---|---|---|---|---|---|---|---|
| Example 22 | 87 | 7.1 | 5.9 | 0 | 0.9994 | 0.0028 | 0.17 | 0.24 | 1320 | 5.66 |
| Comparative example 9 | 87 | 7.1 | 5.9 | 0 | 0.9994 | 0.0014 | 0.17 | 0.24 | 1320 | 5.67 |
| Comparative example 10 | 87 | 7.1 | 5.9 | 0 | 0.9994 | 0.0112 | 0.17 | 0.24 | 1320 | 5.62 |
| Example 23 | 87 | 7.1 | 5.9 | 0 | 0.9994 | 0.011 | 0.34 | 0.24 | 1320 | 5.68 |
| Example 24 | 87 | 7.1 | 5.9 | 0 | 0.9994 | 0.0056 | 0.17 | 0.24 | 1350 | 5.66 |
| Comparative example 11 | 88 | 4 | 8 | 0 | 0.9997 | 0.0056 | 0.17 | 0.24 | 1350 | 5.71 |
| Comparative example 12 | 88 | 6.1 | 5.9 | 0 | 1.0055 | 0.00087 | 0.025 | 0.24 | 1320 | 5.61 |
| Example 25 | 88 | 6.1 | 5.9 | 0 | 0.9994 | 0.0056 | 0.17 | 0.24 | 1320 | 5.73 |
| Example 26 | 88 | 6.1 | 5.9 | 0 | 0.9994 | 0.011 | 0.34 | 0.24 | 1320 | 5.71 |
| Example 27 | 88 | 6.1 | 5.9 | 0 | 0.9994 | 0.0056 | 0.17 | 0.24 | 1350 | 5.65 |
| Comparative example 13 | 89 | 5.1 | 5.9 | 0 | 1.0055 | 0.00087 | 0.025 | 0.24 | 1320 | 5.57 |
| Example 28 | 89 | 5.1 | 5.9 | 0 | 0.9994 | 0.0056 | 0.17 | 0.24 | 1350 | 5.70 |
| Example 29 | 89 | 5.1 | 5.9 | 0 | 0.9994 | 0.0056 | 0.17 | 0.24 | 1320 | 5.62 |
| Example 30 | 89 | 5.1 | 5.9 | 0 | 0.9994 | 0.011 | 0.34 | 0.24 | 1320 | 5.77 |
| Example 31 | 89 | 5.1 | 5.9 | 0 | 0.9969 | 0.017 | 0.51 | 0.24 | 1320 | 5.64 |
| Comparative example 14 | 89 | 9 | 2 | 0 | 0.9997 | 0.0056 | 0.17 | 0.24 | 1320 | 5.66 |
| Comparative example 15 | 91.5 | 4 | 4.5 | 0 | 0.9998 | 0.0056 | 0.17 | 0.24 | 1320 | 5.74 |

In Comparative example 1, the Ca proportion x was a large value of 0.32. The sample was measured by X-ray diffractometry and a CaTiO$_3$ phase was detected. Compared with Examples 1 to 3 in which the Ca proportion x was 0.3, the density was low and the electromechanical coupling factor $k_{31}$ was low by 0.01 to 0.03 at the maximum.

In Comparative example 15, the Ca proportion x was a small value of 0.085. $T_{ot}$ was 0° C., which was higher than −10° C.

In Comparative example 11, the Zr proportion y was a large value of 0.08. The Curie temperature was 96° C., which was less than 100° C.

In Comparative example 14, the Zr proportion y was a small value of 0.02. Compared with Example 29 (y=0.059) in which the Ca proportion x was the same as in Comparative example 14, the electromechanical coupling factor $k_{31}$ was low by 0.06.

In Comparative example 7, the ratio a has a large value of 1.021 and the relative density was a low value of 90%.

In Comparative example 8, the ratio a was a small value of 0.985 and hence abnormal grain growth was observed. The grain size was 50 μm or more. The piezoelectric constant $d_{31}$ was, on average, 4% lower than that in Example 20.

In Comparative example 9, the number of moles of the Li component was less than half of that of the Bi component. Compared with Example 20 in which the same number of moles of the Li and Bi components were weighed, the Curie temperature was low by 2° C. in Comparative example 9.

In Comparative example 10, the number of moles of the Li component was more than that of the Bi component. Compared with Example 20 in which the same number of moles of the Li and Bi components were weighed, the dielectric loss tangent at room temperature was high in Comparative example 10.

Table 2 summarizes $T_C$ and the dielectric loss tangent at room temperature of Comparative examples 9 and 10 and Examples 20 to 22 in Table 1.

TABLE 2

| | Li (wt %) | Bi (wt %) | $T_C$ (° C.) | Dielectric loss tangent (—) |
|---|---|---|---|---|
| Comparative example 9 | 0.0014 | 0.17 | 110 | 0.004 |
| Example 22 | 0.0028 | 0.17 | 110 | 0.003 |
| Example 21 | 0.0045 | 0.17 | 112 | 0.004 |
| Example 20 | 0.0056 | 0.17 | 112 | 0.004 |
| Comparative example 10 | 0.0112 | 0.17 | 112 | 0.01 |

TABLE 3

| | BaTiO$_3$ (Mol %) | CaTiO$_3$ (Mol %) | CaZrO$_3$ (Mol %) | Li (wt %) | Bi (wt %) | Tc (° C.) | $T_{to}$ (° C.) | $T_{ot}$ (° C.) |
|---|---|---|---|---|---|---|---|---|
| Comparative example 6 | 87 | 7.1 | 5.9 | 0.00084 | 0.025 | 110 | −26 | −16 |
| Example 20 | 87 | 7.1 | 5.9 | 0.0056 | 0.17 | 112 | −34 | −24 |
| Example 23 | 87 | 7.1 | 5.9 | 0.011 | 0.34 | 112 | −42 | −36 |
| Comparative example 12 | 88 | 6.1 | 5.9 | 0.00084 | 0.025 | 110 | −18 | −7 |
| Example 25 | 88 | 6.1 | 5.9 | 0.0056 | 0.17 | 112 | −26 | −15 |
| Example 26 | 88 | 6.1 | 5.9 | 0.011 | 0.34 | 112 | −36 | −30 |
| Comparative example 13 | 89 | 5.1 | 5.9 | 0.00084 | 0.025 | 108 | −12 | 3 |

TABLE 3-continued

|  | BaTiO$_3$ (Mol %) | CaTiO$_3$ (Mol %) | CaZrO$_3$ (Mol %) | Li (wt %) | Bi (wt %) | Tc (° C.) | T$_{to}$ (° C.) | T$_{ot}$ (° C.) |
|---|---|---|---|---|---|---|---|---|
| Example 29 | 89 | 5.1 | 5.9 | 0.0056 | 0.17 | 112 | −20 | −5 |
| Example 30 | 89 | 5.1 | 5.9 | 0.011 | 0.34 | 110 | −36 | −30 |

Table 3 summarizes the phase transition temperatures of Comparative examples 6, 12, and 13 and Examples 20, 23, 25, 26, 29, and 30 in Table 1. By adding the Li and Bi components, T$_{to}$ and T$_{ot}$ were decreased without decreasing T$_C$ of piezoelectric materials.

In order to evaluate the durability of piezoelectric elements, samples of Examples and Comparative examples in Table 3 were placed in a thermostat and subjected to a temperature cycle test. A temperature cycle of 25° C.→−20° C.→50° C.→25° C. was defined as a single cycle and this cycle was repeated 100 times. The piezoelectric constants d$_{31}$ before and after the cycle test was compared. In the samples having T$_{to}$ of −20° C. or less (Examples 20, 23, 25, 26, 29, and 30), the variation ratio of the piezoelectric property was 5% or less. In contrast, in the samples having T$_{to}$ of more than −20° C. (Comparative examples 12 and 13), the piezoelectric constant d$_{31}$ was decreased by more than 5%. In Comparative example 6 in which T$_{to}$ was −20° C. or less, the variation ratio of the piezoelectric constant d$_{31}$ before and after the cycle test was 5% or less; however, the mechanical quality factor at room temperature was about 200 lower than that in Example 20.

The samples having T$_{to}$ of more than −20° C. repeatedly underwent phase transition between a tetragonal crystal and an orthorhombic crystal during the temperature cycle test. Such repeated phase transitions between crystal systems having different spontaneous polarization directions probably promoted depolarization, so that the piezoelectric constant d$_{31}$ was considerably decreased in the samples having T$_{to}$ of more than −20° C. That is, piezoelectric ceramics having T$_{to}$ of more than −20° C. have low durability as elements.

Figure 15:
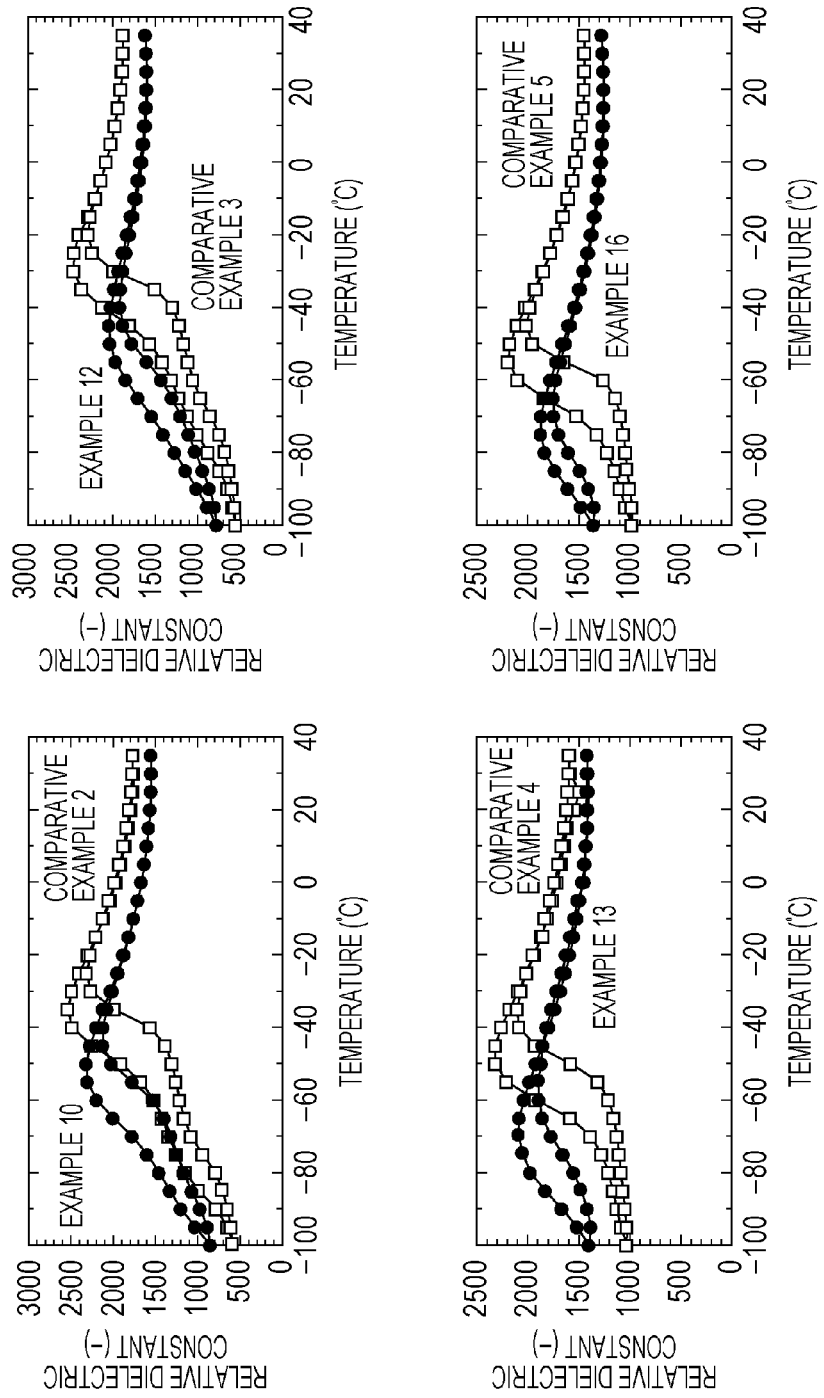
FIG. 15 illustrates the temperature dependency of each relative dielectric constant of piezoelectric materials in Comparative examples 2 to 5 and Examples 10, 12, 13, and 16.
Figure 16:
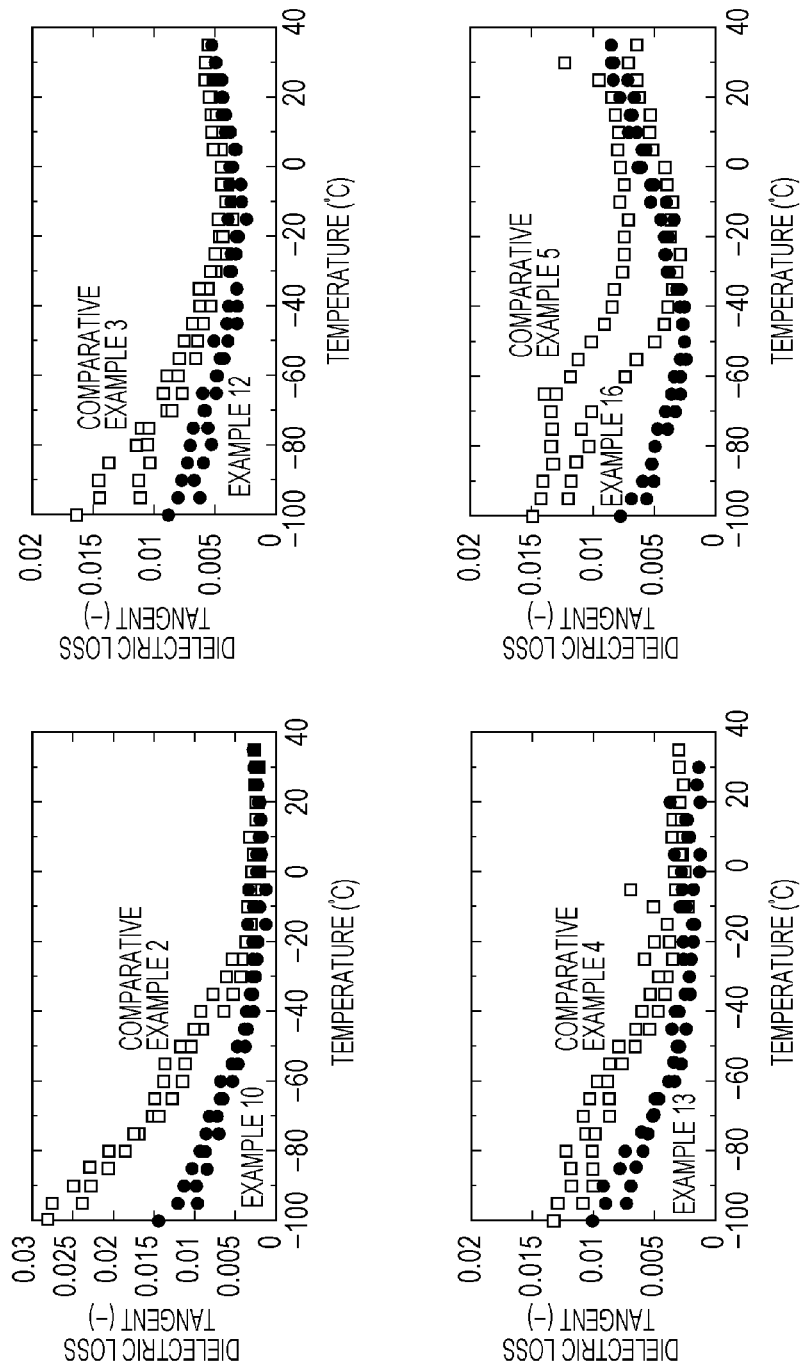
FIG. 16 illustrates the temperature dependency of each dielectric loss tangent of piezoelectric materials in Comparative examples 2 to 5 and Examples 10, 12, 13, and 16.
Figure 17:
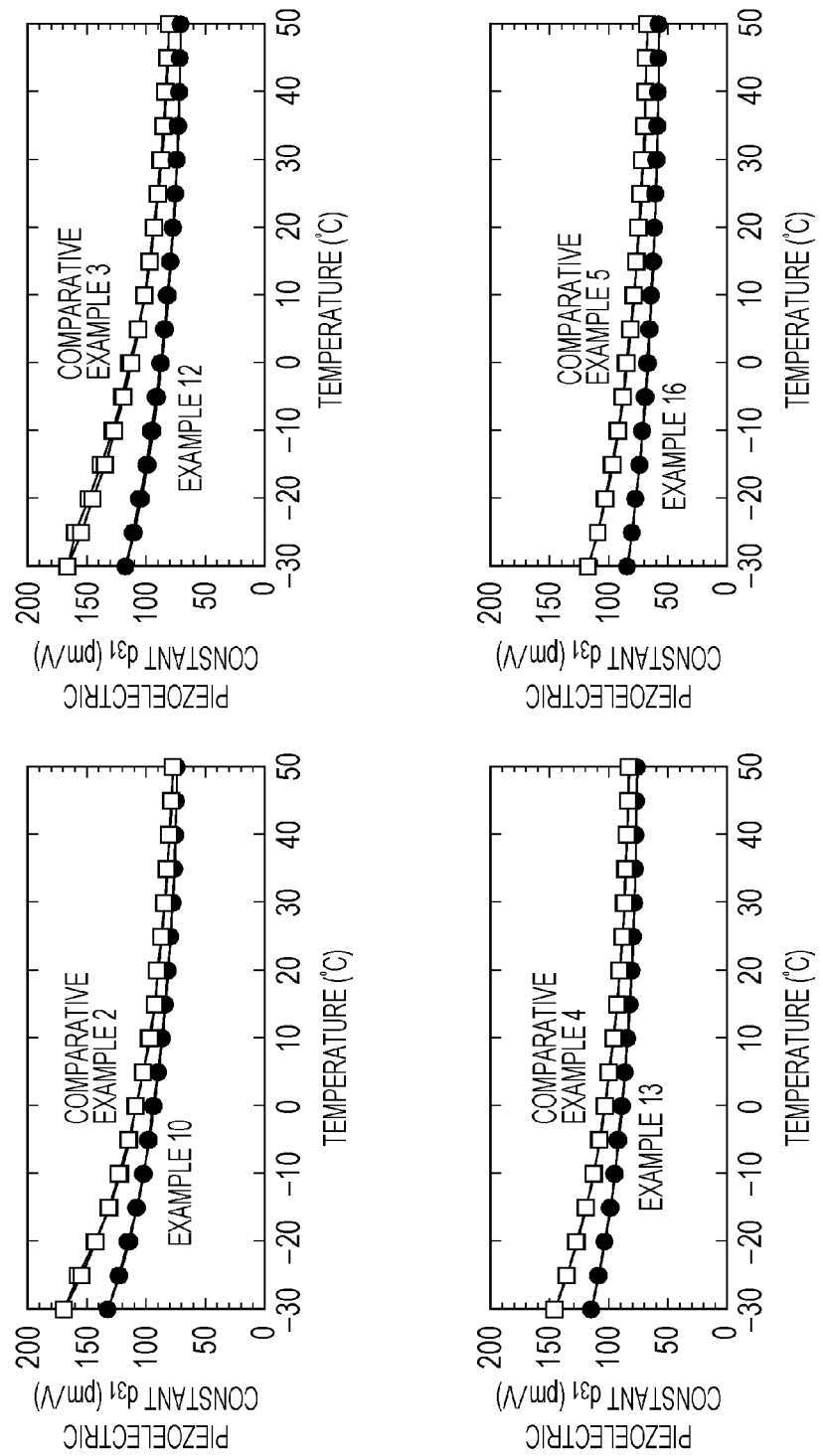
FIG. 17 illustrates the temperature dependency of each piezoelectric constant $d_{31}$ of piezoelectric materials in Comparative examples 2 to 5 and Examples 10, 12, 13, and 16.
Figure 18:
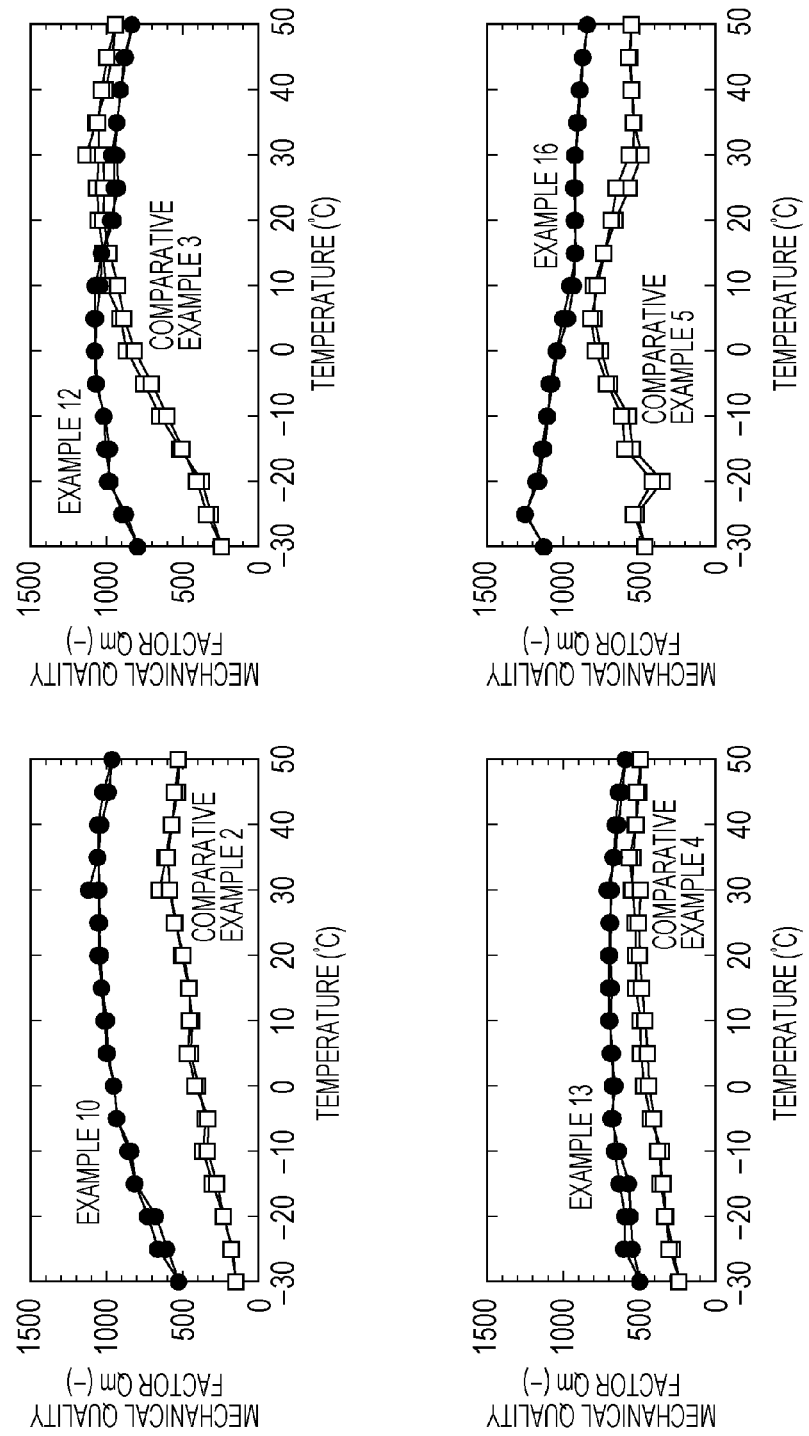
FIG. 18 illustrates the temperature dependency of each mechanical quality factor of piezoelectric materials in Comparative examples 2 to 5 and Examples 10, 12, 13, and 16.

FIGS. 15 to 18 illustrate the temperature dependency of the relative dielectric constant, the dielectric loss tangent, the piezoelectric constant d$_{31}$, and the mechanical quality factor of Comparative examples 2 to 5 and Examples 10, 12, 13 and 16 in Table 1. FIG. 15 indicates that addition of Li and Bi components causes a decrease in the phase transition temperature and a decrease in the variation width of the relative dielectric constant within the measurement temperature range. FIG. 16 indicates that addition of Li and Bi components causes a considerable decrease in the dielectric loss tangent in the temperature range of −20° C. or less. FIG. 17 indicates that addition of Li and Bi components causes a decrease in the variation width of the piezoelectric constant d$_{31}$ within the measurement temperature range. FIG. 18 indicates that addition of Li and Bi components causes an increase in the mechanical quality factor within the measurement temperature range.

Examples 32 to 39 and Comparative Examples 16 to 19

A barium titanate powder, a calcium titanate powder, a calcium zirconate powder, a lithium carbonate powder, a bismuth oxide powder, a tetramanganese trioxide powder, and a glass aid containing Si and B (containing 30 to 50 wt % of SiO$_2$ and 21.1 wt % of B$_2$O$_3$) that each had an average particle size of 100 nm were weighed such that molar ratios in Table 5 below were satisfied. Subsequently, compacts were formed in the same manner as in the samples in Table 1. The

TABLE 4

|  | BaTiO$_3$ (Mol %) | CaTiO$_3$ (Mol %) | CaZrO$_3$ (Mol %) | CaSnO$_3$ (Mol %) | Mn (wt %) | Mechanical quality factor (—) |
|---|---|---|---|---|---|---|
| Example 9 | 83 | 10.5 | 5.5 | 1 | 0.18 | 1221 |
| Example 10 | 83 | 10.5 | 6.5 | 0 | 0.18 | 1054 |
| Example 11 | 83 | 10.5 | 5.5 | 1 | 0.36 | 1082 |
| Example 12 | 83 | 10.5 | 6.5 | 0 | 0.36 | 923 |
| Example 13 | 84 | 11 | 4 | 1 | 0.18 | 743 |
| Example 14 | 84 | 11 | 5 | 0 | 0.18 | 686 |
| Example 15 | 84 | 11 | 4 | 1 | 0.36 | 1285 |
| Example 16 | 84 | 11 | 5 | 0 | 0.36 | 931 |

Table 4 summarizes the mechanical quality factors of the piezoelectric materials of Examples 9 to 16 in Table 1. Addition of Sn instead of Zr increased the mechanical quality factors.

compacts were placed in an electric furnace and held at 1200° C. for 5 hours, so that the compacts were sintered for 24 hours in total in the ambient atmosphere. After that, the samples were processed and evaluated as with the samples in Table 1.

TABLE 5

|  | BaTiO$_3$ (Mol %) | CaTiO$_3$ (Mol %) | CaZrO$_3$ (Mol %) | Glass aid (wt %) | a (—) | Li (wt %) | Bi (wt %) | Mn (wt %) | Sintering temperature (° C.) | Density (g/cm$^3$) |
|---|---|---|---|---|---|---|---|---|---|---|
| Comparative example 16 | 87 | 10 | 3 | 0.1 | 1.0079 | 0.00084 | 0.025 | 0.3 | 1200 | 5.46 |
| Example 32 | 87 | 10 | 3 | 0.1 | 1.0019 | 0.0028 | 0.084 | 0.3 | 1200 | 5.57 |

TABLE 5-continued

| | BaTiO$_3$ (Mol %) | CaTiO$_3$ (Mol %) | CaZrO$_3$ (Mol %) | Glass aid (wt %) | a (—) | Li (wt %) | Bi (wt %) | Mn (wt %) | Sintering temperature (° C.) | Density (g/cm$^3$) |
|---|---|---|---|---|---|---|---|---|---|---|
| Example 33 | 87 | 10 | 3 | 0.1 | 1.0019 | 0.0056 | 0.17 | 0.3 | 1200 | 5.57 |
| Comparative example 17 | 87 | 10 | 3 | 0.1 | 0.9900 | 0.0056 | 0.17 | 0 | 1200 | 5.61 |
| Comparative example 18 | 87 | 10 | 3 | 0.1 | 1.0060 | 0.0056 | 0.17 | 0.4 | 1200 | 5.52 |
| Example 34 | 87 | 10 | 3 | 0.1 | 1.0019 | 0.0084 | 0.25 | 0.3 | 1200 | 5.57 |
| Example 35 | 87 | 10 | 3 | 0.1 | 0.9968 | 0.028 | 0.84 | 0.3 | 1200 | 5.65 |
| Comparative example 19 | 87 | 10 | 3 | 0.1 | 0.9968 | 0.056 | 1.69 | 0.3 | 1200 | 5.55 |
| Example 36 | 88 | 8 | 4 | 0.1 | 1.0019 | 0.0084 | 0.25 | 0.3 | 1200 | 5.65 |
| Example 37 | 89 | 8 | 3 | 0.1 | 1.0019 | 0.0084 | 0.25 | 0.3 | 1200 | 5.71 |
| Example 38 | 90 | 7 | 3 | 0.1 | 1.0019 | 0.0084 | 0.25 | 0.3 | 1200 | 5.69 |
| Example 39 | 91 | 5 | 4 | 0.1 | 1.0019 | 0.0084 | 0.25 | 0.3 | 1200 | 5.76 |

The sample in Comparative example 17 did not contain Mn and had at least 200 lower mechanical quality factor Qm than that in Example 33.

The sample in Comparative example 18 contained more than 0.36 parts by weight of Mn and had a dielectric loss tangent that was higher than 0.01, which was higher than the dielectric loss tangent (0.005) in Example 33.

TABLE 6

| | Li (wt %) | Bi (wt %) | Electromechanical coupling factor $k_{31}$ (—) | Young's modulus $Y_{11}$ (GPa) | Piezoelectric constant $d_{31}$ (pm/V) | Mechanical quality factor Qm (—) | Relative dielectric constant $\varepsilon_r$ (—) | $T_{ot}$ (° C.) | $T_{to}$ (° C.) | Tc (° C.) |
|---|---|---|---|---|---|---|---|---|---|---|
| Comparative example 16 | 0.00084 | 0.025 | 0.228 | 121 | 72 | 669 | 1347 | −42 | −30 | 116 |
| Example 32 | 0.0028 | 0.084 | 0.215 | 126 | 62 | 909 | 1198 | −55 | −40 | 118 |
| Example 33 | 0.0056 | 0.17 | 0.207 | 131 | 56 | 973 | 1101 | −65 | −55 | 120 |
| Example 34 | 0.0084 | 0.25 | 0.197 | 134 | 52 | 1044 | 1037 | −70 | −65 | 116 |
| Example 35 | 0.028 | 0.84 | 0.159 | 144 | 37 | 876 | 876 | <−100 | <−100 | 118 |
| Comparative example 19 | 0.056 | 1.69 | 0.153 | 146 | 32 | 779 | 721 | <−100 | <−100 | 120 |

Table 6 summarizes the electromechanical coupling factor $k_{31}$, the Young's modulus $Y_{11}$, the piezoelectric constant $d_{31}$, the mechanical quality factor Qm, and the relative dielectric constant $\varepsilon_r$ measured at room temperature in the cases where the amounts of the Li and Bi components added were changed. From Table 6, as the amounts of the Li and Bi components added increase, $k_{31}$, $d_{31}$, and the relative dielectric constant at room temperature gradually decrease. This is because the temperatures ($T_{ot}$ and $T_{to}$) of phase transition between a tetragonal crystal and an orthorhombic crystal are decreased. From Table 6, as the amounts of the Li and Bi components added increase, the mechanical quality factor increases and then decreases.

In Comparative example 16, the amounts of the Li and Bi components added are respectively less than 0.0013 parts by weight and 0.028 parts by weight and the mechanical quality factor is the lowest.

In Comparative example 19, the amounts of the Li and Bi components added are respectively more than 0.028 parts by weight and 0.858 parts by weight and the electromechanical coupling factor $k_{31}$ is less than 70% of that of Comparative example 16.

Example 40

Barium titanate (BaTiO$_3$), calcium titanate (CaTiO$_3$), calcium zirconate (CaZrO$_3$), lithium carbonate (Li$_2$CO$_3$), bismuth oxide (Bi$_2$O$_3$), tetramanganese trioxide (Mn$_3$O$_4$), and a glass aid containing Si and B (containing 30 to 50 wt % of SiO$_2$ and 21.1 wt % of B$_2$O$_3$) were weighed such that the composition of Example 33 in Table 5 was satisfied. The thus-weighed raw material powders were mixed with a ball mill overnight to provide a powder mixture.

This powder mixture was mixed with PVB and subsequently used to form sheets by the doctor blade method to provide green sheets having a thickness of 50 μm.

A conductive paste for internal electrodes was applied to the green sheets by printing. The conductive paste was an alloy paste (Ag: 60%, Pd: 40%). Nine green sheets to which the conductive paste was applied were stacked. This stacked body was fired at 1200° C. for 5 hours to provide a sintered body. This sintered body was cut so as to have dimensions of 10 mm×2.5 mm. Side surfaces of the resultant member were polished and a pair of external electrodes (first electrode and second electrode) that alternately short-circuit the internal electrodes were formed by sputtering with Au. Thus, a multilayered piezoelectric element in FIG. 2B was produced.

The internal electrodes of the multilayered piezoelectric element were observed. The Ag—Pd material serving as the electrode material and the piezoelectric material were alternately formed.

Prior to evaluation of piezoelectric properties, the sample was subjected to a poling process. Specifically, the sample was heated in an oil bath at 100° C.; a voltage of 1 kV/mm was applied between the first electrode and the second electrode for 30 minutes; and, while the voltage was applied, the sample was cooled to room temperature.

The piezoelectric properties of the multilayered piezoelectric element were evaluated. As a result, the multilayered piezoelectric element had a sufficiently high insulation property and had good piezoelectric properties equivalent to those of the piezoelectric material of Example 33.

Example 41

A powder mixture was prepared in the same manner as in Example 40. While the powder mixture was rotated, it was calcined in the air at 1000° C. for 3 hours to provide a calcined powder. This calcined powder was crushed with a ball mill. The resultant calcined powder was mixed with PVB and subsequently used to form sheets by the doctor blade method to provide green sheets having a thickness of 50 µm. A conductive paste for internal electrodes was applied to the green sheets by printing. The conductive paste used was Ni paste. Nine green sheets to which the conductive paste was applied were stacked. This stacked body was subjected to thermo-compression bonding.

This bonded stacked body was fired in a tubular furnace: the stacked body was fired up to 300° C. in the air to remove the binder; and the atmosphere was then changed to a reducing atmosphere ($H_2:N_2=2:98$, oxygen concentration: $2\times10^{-6}$ Pa) and the stacked body was held at 1200° C. for 5 hours. The stacked body was cooled to 1000° C.; subsequently the oxygen concentration was changed to 30 Pa and the stacked body was further cooled to room temperature.

The thus-obtained sintered body was cut so as to have dimensions of 10 mm×2.5 mm. Side surfaces of the resultant member were polished and a pair of external electrodes (first electrode and second electrode) that alternately short-circuit the internal electrodes were formed by sputtering with Au. Thus, a multilayered piezoelectric element in FIG. 2B was produced.

The internal electrodes of the multilayered piezoelectric element were observed. The Ni material serving as the electrode material and the piezoelectric material layer were alternately formed. The multilayered piezoelectric element was subjected to a poling process: an electric field of 1 kV/mm was applied for 30 minutes to the multilayered piezoelectric element in an oil bath at 100° C. The piezoelectric properties of the multilayered piezoelectric element were evaluated. As a result, the multilayered piezoelectric element had a sufficiently high insulation property and had good piezoelectric properties equivalent to those of the piezoelectric element of Example 33.

Example 42

The piezoelectric element in Example 15 was employed and the liquid discharge head in FIGS. 3A and 3B was produced. The liquid discharge head discharged ink in response to input electric signals.

Example 43

The liquid discharge head in Example 42 was employed and the liquid discharge apparatus in FIG. 4 was produced. The liquid discharge apparatus discharged ink on a recording medium in response to input electric signals.

Example 44

The piezoelectric element in Example 15 was employed and the ultrasonic motor in FIG. 6A was produced. The motor rotated under application of alternating voltages.

Example 45

The ultrasonic motor in Example 44 was employed and the optical apparatus in FIGS. 7A and 7B was produced. The optical apparatus performed automatic focusing under application of alternating voltages.

Example 46

The piezoelectric element in Example 15 was employed and the dust removing apparatus in FIGS. 9A and 9B was produced. The dust removing apparatus under application of alternating voltages exhibited a high dust removing ratio for scattered plastic beads.

Example 47

The dust removing apparatus in Example 46 was employed and the image pickup apparatus in FIG. 12 was produced. When the image pickup apparatus was operated, dust on the surface of the image pickup unit was sufficiently removed and images without dust defects were obtained.

Example 48

The multilayered piezoelectric element in Example 40 was employed and the liquid discharge head in FIGS. 3A and 3B was produced. The liquid discharge head discharged ink in response to input electric signals.

Example 49

The liquid discharge head in Example 48 was employed and the liquid discharge apparatus in FIG. 4 was produced. The liquid discharge apparatus discharged ink on a recording medium in response to input electric signals.

Example 50

The multilayered piezoelectric element in Example 40 was employed and the ultrasonic motor in FIG. 6B was produced. The motor rotated under application of alternating voltages.

Example 51

The ultrasonic motor in Example 50 was employed and the optical apparatus in FIGS. 7A and 7B was produced. The optical apparatus performed automatic focusing under application of alternating voltages.

Example 52

The multilayered piezoelectric element in Example 40 was employed and the dust removing apparatus in FIGS. 9A and 9B was produced. The dust removing apparatus under application of alternating voltages exhibited a high dust removing ratio for scattered plastic beads.

Example 53

The dust removing apparatus in Example 46 was employed and the image pickup apparatus in FIG. 12 was produced. When the image pickup apparatus was operated, dust on the surface of the image pickup unit was sufficiently removed and images without dust defects were obtained.

Example 54

The multilayered piezoelectric element in Example 40 was employed and an electronic apparatus in FIG. 14 was produced. The loudspeaker functioned under application of alternating voltages.

A piezoelectric material according to an embodiment of the present invention exhibits good piezoelectric properties even at high ambient temperatures. The piezoelectric material contains no lead and places less load on the environment. Thus, the piezoelectric material can be used for apparatuses manufactured using a large amount of piezoelectric material, such as liquid discharge heads, ultrasonic motors, and dust removing apparatuses, without problems.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-287243, filed Dec. 28, 2012, which is hereby incorporated by reference herein in its entirety.

What is claimed is:

1. A piezoelectric material comprising:
a main component containing a perovskite-type metal oxide represented by a general formula (1) below;
Mn as a first subcomponent;
Li as a second subcomponent; and
Bi as a third subcomponent,
wherein a Mn content relative to 100 parts by weight of the metal oxide is 0.04 parts by weight or more and 0.36 parts by weight or less on a metal basis, a Li content α relative to 100 parts by weight of the metal oxide is 0.0013 parts by weight or more and 0.0280 parts by weight or less on a metal basis, a Bi content β relative to 100 parts by weight of the metal oxide is 0.042 parts by weight or more and 0.850 parts by weight or less on a metal basis, and the contents α and β satisfy 0.5≤(α·MB)/(β·ML)≤1 (where ML represents an atomic weight of Li and MB represents an atomic weight of Bi)

(where x, y, z, and a satisfy 0.09≤x≤0.30, 0.025≤y≤0.074, 0≤z≤0.02, and 0.986≤a≤1.02).

2. The piezoelectric material according to claim 1, further comprising a fourth subcomponent containing at least one of Si and B, wherein a content of the fourth subcomponent relative to 100 parts by weight of the metal oxide represented by the general formula (1) is 0.001 parts by weight or more and 4.000 parts by weight or less on a metal basis.

3. The piezoelectric material according to claim 1, wherein α and β satisfy 0.19<2.15α+1.11β<1.

4. The piezoelectric material according to claim 2, wherein x, y, and z in the general formula (1) satisfy y+z≤(11x/14)−0.037.

5. The piezoelectric material according to claim 2, wherein phase transition does not occur in the piezoelectric material in a temperature range of −60° C. or more and 100° C. or less.

6. A piezoelectric element comprising:
a first electrode,
a piezoelectric material part, and
a second electrode,
wherein the piezoelectric material part contains the piezoelectric material according to claim 1.

7. A multilayered piezoelectric element comprising:
a piezoelectric material layer, and
an electrode layer including an internal electrode,
wherein the piezoelectric material layer and the electrode layer are alternately stacked, and the piezoelectric material layer contains the piezoelectric material according to claim 1.

8. The multilayered piezoelectric element according to claim 7, wherein the internal electrode contains Ag and Pd such that a weight ratio M1/M2 of a Ag weight content M1 to a Pd weight content M2 satisfies 0.25≤M1/M2≤4.0.

9. The multilayered piezoelectric element according to claim 7, wherein the internal electrode contains at least one of Ni and Cu.

10. A liquid discharge head comprising:
a liquid chamber including a vibrating unit including the piezoelectric element according to claim 6; and
a discharge port in communication with the liquid chamber.

11. A liquid discharge apparatus comprising:
a transfer medium mounting unit; and
the liquid discharge head according to claim 10.

12. An ultrasonic motor comprising:
a vibrating member including the piezoelectric element according to claim 6; and
a moving member in contact with the vibrating member.

13. An optical apparatus comprising a drive unit including the ultrasonic motor according to claim 12.

14. A vibratory apparatus comprising a vibrating member including the piezoelectric element according to claim 6 disposed on a vibrating plate.

15. A dust removing apparatus comprising a vibrating unit including the vibratory apparatus according to claim 14.

16. An image pickup apparatus comprising:
the dust removing apparatus according to claim 15; and
an image pickup element unit,
wherein the dust removing apparatus includes the vibrating plate disposed on a light-receiving surface side of the image pickup element unit.

17. An electronic apparatus comprising a piezoelectric acoustic component including the piezoelectric element according to claim 6.

18. A liquid discharge head comprising:
a liquid chamber including a vibrating unit including the multilayered piezoelectric element according to claim 7; and
a discharge port in communication with the liquid chamber.

19. A liquid discharge apparatus comprising:
a transfer medium mounting unit; and
the liquid discharge head according to claim 18.

20. An ultrasonic motor comprising:
a vibrating member including the multilayered piezoelectric element according to claim 7; and
a moving member in contact with the vibrating member.

21. An optical apparatus comprising a drive unit including the ultrasonic motor according to claim 20.

22. A vibratory apparatus comprising a vibrating member including the multilayered piezoelectric element according to claim 7 disposed on a vibrating plate.

23. A dust removing apparatus comprising a vibrating unit including the vibratory apparatus according to claim 22.

24. An image pickup apparatus comprising:
the dust removing apparatus according to claim 23; and
an image pickup element unit,
wherein the dust removing apparatus includes the vibrating plate disposed on a light-receiving surface side of the image pickup element unit.

25. An electronic apparatus comprising a piezoelectric acoustic component including the multilayered piezoelectric element according to claim 7.

26. A device having the piezoelectric material defined in claim 1.

\* \* \* \* \*